(12) United States Patent
Ishii et al.

(10) Patent No.: US 8,154,071 B2
(45) Date of Patent: Apr. 10, 2012

(54) NONVOLATILE SEMICONDUCTOR MEMORY DEVICE AND METHOD FOR FABRICATING NONVOLATILE SEMICONDUCTOR MEMORY DEVICE

(75) Inventors: Hiroyuki Ishii, Kanagawa-ken (JP); Takafumi Ikeda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 117 days.

(21) Appl. No.: 12/467,689

(22) Filed: May 18, 2009

(65) Prior Publication Data

US 2009/0283813 A1    Nov. 19, 2009

(30) Foreign Application Priority Data

May 19, 2008 (JP) ................................. 2008-130483
Apr. 27, 2009 (JP) ................................. 2009-108352

(51) Int. Cl.
*H01L 29/788* (2006.01)
*H01L 21/336* (2006.01)

(52) U.S. Cl. ........ 257/317; 257/315; 257/316; 438/257; 438/261

(58) Field of Classification Search .......................... None
See application file for complete search history.

(56) References Cited

U.S. PATENT DOCUMENTS

| | | | |
|---|---|---|---|
| 5,677,216 A | | 10/1997 | Tseng |
| 6,184,085 B1 * | | 2/2001 | Jeong ............................ 438/258 |
| 6,713,834 B2 * | | 3/2004 | Mori et al. .................... 257/510 |
| 6,806,132 B2 | | 10/2004 | Mori et al. |
| 7,061,069 B2 | | 6/2006 | Mori et al. |
| 7,420,259 B2 | | 9/2008 | Mori et al. |

(Continued)

FOREIGN PATENT DOCUMENTS

JP         10-335497        12/1998

OTHER PUBLICATIONS

U.S. Appl. No. 10/868,927, filed Jun. 17, 2004, Seiichi Mori, et al.

*Primary Examiner* — N Drew Richards
*Assistant Examiner* — Peter Bradford
(74) *Attorney, Agent, or Firm* — Oblon, Spivak, McClelland, Maier & Neustadt, L.L.P.

(57) ABSTRACT

According to an aspect of the present invention, there is provided a method for fabricating a nonvolatile semiconductor memory device including a memory cell being formed in a first region of a semiconductor substrate and a periphery circuit being formed in a second region of the semiconductor substrate, including forming a first gate electrode material film over the semiconductor substrate via a first gate insulator in the first region, etching the first gate electrode material film and the first gate insulator using a mask having a first opening in a first element isolation of the first region, etching the semiconductor substrate to a first depth to form a first isolation groove, forming a first insulation isolation layer in the first isolation groove, forming a second insulator on the first insulation isolation layer and on the first gate electrode, removing the second insulator by anisotropic etching, etching an upper portion of the first gate electrode to a second depth to form a first concave portion on the upper portion of the first gate electrode, etching the first side-wall film and the first insulation isolation layer to a depth at a bottom surface of the first concave portion, forming a second gate insulator on the upper portion of the first gate electrode, and forming a second gate electrode material film on the second gate insulator.

3 Claims, 23 Drawing Sheets

U.S. PATENT DOCUMENTS

2002/0093073 A1* 7/2002 Mori et al. .................... 257/510
2005/0167732 A1* 8/2005 Iguchi et al. .................. 257/315
2006/0097307 A1* 5/2006 Sato et al. .................... 257/315
2007/0152264 A1* 7/2007 Kim ............................. 257/321
2007/0262372 A1* 11/2007 Yamamoto et al. ........... 257/324
2007/0264774 A1* 11/2007 Luo et al. ..................... 438/257
2007/0278560 A1* 12/2007 Watanabe ..................... 257/315

* cited by examiner

NONVOLATILE SEMICONDUCTOR MEMORY DEVICE AND METHOD FOR FABRICATING NONVOLATILE SEMICONDUCTOR MEMORY DEVICE

CROSS REFERENCE TO RELATED APPLICATION

This application is based upon and claims the benefit of priority from the prior Japanese Patent Application No. JP2008-130483, filed May 19, 2008 and the prior Japanese Patent Application No. JP2009-108352, filed Apr. 24, 2009; the entire contents of which are incorporated herein by reference.

The present invention relates to a nonvolatile semiconductor memory device and a method for fabricating the nonvolatile semiconductor memory device.

DESCRIPTION OF THE BACKGROUND

EEPROM (Electrically Erasable and Programmable Read only Memory) having an electrically erasable and programmable memory transistor including a stacked electrode structure with a floating gate electrode and a control gate electrode in order as a non-volatile semiconductor memory device.

The EEPROM has been demanded on shrinking for miniaturization of a chip size. In the shrinking of the EEPROM, the floating gate electrode is thinned for sustaining aspects, for example, a shallow trench isolation being embedded with an insulator and a contact plug connecting between a metal wiring and a semiconductor substrate so as to decrease a size of a dielectric film, so that an electrostatic capacity being sandwiched between the floating gate electrode and the control gate electrode is decreased.

When the electrostatic capacity of the dielectric film is decreased, coupling ratio determined by an electrostatic capacity of a tunnel oxide film and an electrostatic capacity of a dielectric film is decreased so that cell characteristics such as programming characteristic of memory information and/or erase characteristic of memory information in the memory cell are deteriorated. The deterioration is a serious problem in semiconductor technology.

Japanese Patent Publication (Kokai) H10-335497 has been known as an issue disclosing a non-volatile semiconductor memory device sustaining coupling ratio and a fabrication method. Decreasing a size of an element region and increasing a surface area of the floating gate electrode are disclosed in Japanese Patent Publication (Kokai) 10-335497.

The non-volatile semiconductor memory device disclosed in Japanese Patent Publication (Kokai) 10-335497 includes an isolation insulator formed at least in one side of a p-channel region in a semiconductor substrate, a gate insulator being formed on the p-channel region, a floating gate being formed on the gate insulator and having a concave-type shape, an interlayer insulator being formed on the floating gate and a control gate being formed on the interlayer insulator.

The floating gate having the concave-type is formed by processing steps mentioned below, for example. First, a layer for the floating gate is formed on an isolation insulator formed as a convex-type to the semiconductor substrate and a concave-convex formed on the surface of the gate insulator. Next, a surface with concave portion at an upper portion of the gate insulator is formed.

However, the element isolation region and, subsequently, the floating gate electrode are formed in the fabrication method of the non-volatile semiconductor memory device disclosed in Japanese Patent Publication (Kokai) 10-335497.

As a result, problems generates such as complication of the processing steps, for example, having two planarization processes, and/or being restricted a width of the concave-type shape in the floating gate by resolution in lithography technique.

SUMMARY OF THE INVENTION

According to an aspect of the invention, there is provided, a method for fabricating a nonvolatile semiconductor memory device including a memory cell being formed in a first region of a semiconductor substrate and a periphery circuit being formed in a second region of the semiconductor substrate, including, forming a first gate electrode material film over the semiconductor substrate via a first gate insulator in the first region, forming a cap insulator on the first gate electrode material film, etching the cap insulator, the first gate electrode material film and the first gate insulator using a mask having a first opening in a first element isolation of the first region to separately form a first gate electrode, etching the semiconductor substrate to a first depth to form a first isolation groove, forming a first insulator over the semiconductor substrate, removing the first insulator to expose an upper surface the cap insulator and to form a first insulation isolation layer in the first isolation groove, removing the cap insulator to expose an upper surface of the first gate electrode and a side-wall of the first insulation isolation layer, forming a second insulator on the first insulation isolation layer and the first gate electrode, removing the second insulator by anisotropic etching and forming a first side-wall film on the first insulation isolation layer, etching an upper portion of the first gate electrode to a second depth using the first side-wall film as a mask to form a first concave portion on the upper portion of the first gate electrode, etching the first side-wall film and the first insulation isolation layer to a depth at a bottom surface of the first concave portion to expose the upper portion of the first gate electrode, forming a second gate insulator on the upper portion of the first gate electrode and the first insulation isolation layer, and forming a second gate electrode material film on the second gate insulator to embedded into the first concave portion.

Further, another aspect of the invention, there is provided, a nonvolatile semiconductor memory device, including a memory cell including a cell transistor and a first insulation isolation layer, the cell transistor including a first gate insulator formed in a first region of a semiconductor substrate, a first gate electrode formed on the first gate insulator, an upper portion of the first gate electrode having a first concave portion, a second gate insulator covering the upper portion of the first gate electrode, a second gate electrode being embedded into the first concave portion and being formed on the second gate insulator, wherein the first insulation isolation layer in the first region is extended to the first gate electrode side to be embedded in the semiconductor substrate to electrically separate the cell transistor, a periphery circuit including a transistor and a second insulation isolation layer, the transistor being formed in a second region of the semiconductor substrate and including a third gate insulator being the same material as the first gate insulator, a gate electrode having a first conductive layer and a second conductive layer, the first conductive layer being formed on the third gate insulator, the second conductive layer having the same property as the first gate electrode and being formed to contact with the upper surface of the first conductive layer, wherein the second insulation isolation layer in the second region is extended to the second gate electrode side to be embedded in the semiconductor substrate to electrically separate the transistor.

DETAILED DESCRIPTION OF THE INVENTION

Figure 1:
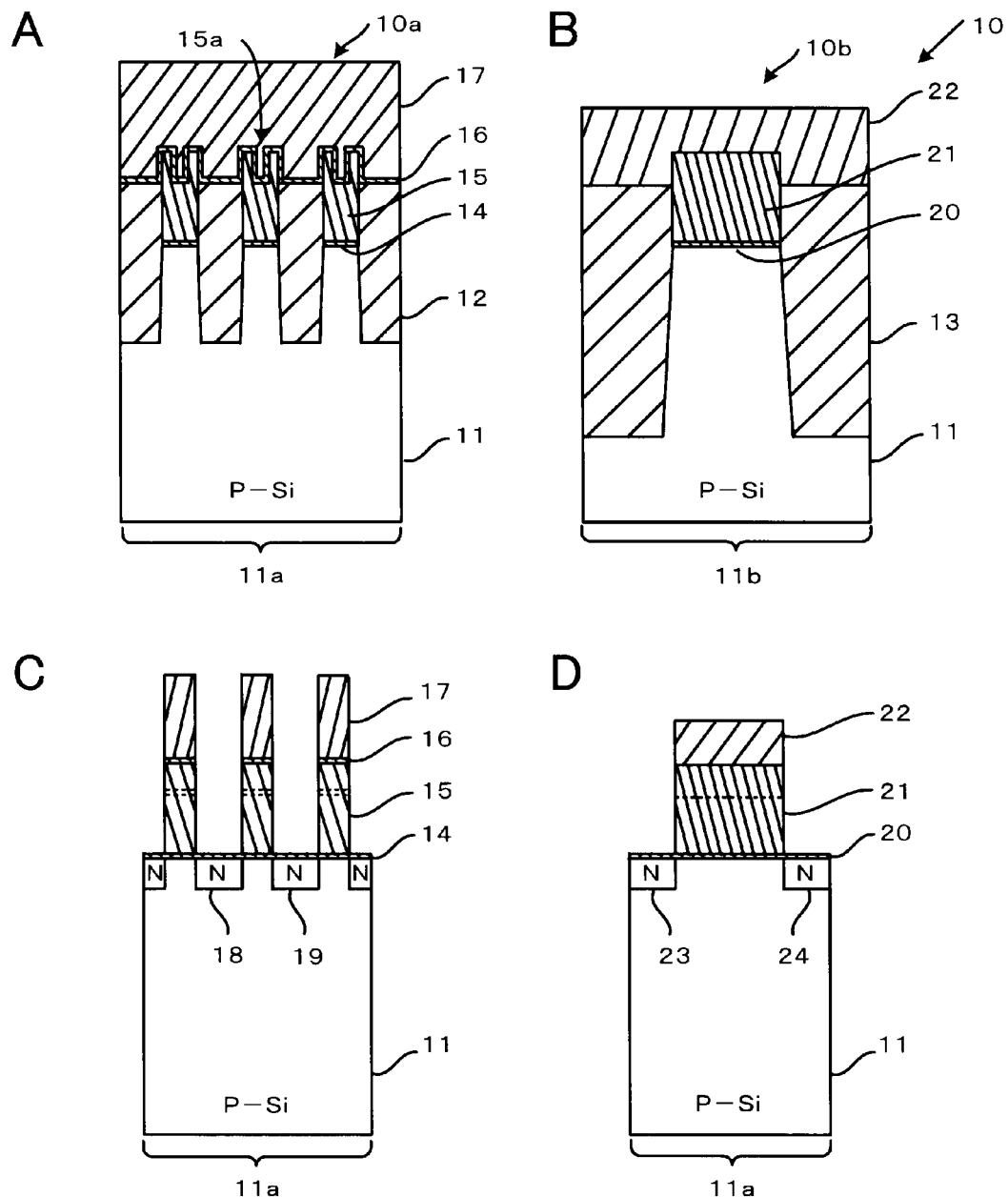
FIG. 1A is a cross-sectional view along a word line direction showing a memory cell.
FIG. 1B is a cross-sectional view along the word line direction showing a periphery circuit.
FIG. 1C is a cross-sectional view along a bit line direction showing the memory cell and FIG. 1D is a cross-sectional view along the bit line direction showing the periphery circuit.

Embodiments of the present invention will be described below in detail with reference to the drawing mentioned above.

First Embodiment

First, according to a first embodiment of the present invention, a nonvolatile memory semiconductor device and fabricating processes of the nonvolatile memory semiconductor device are explained with reference to FIGS. 1-19.

Figure 2:
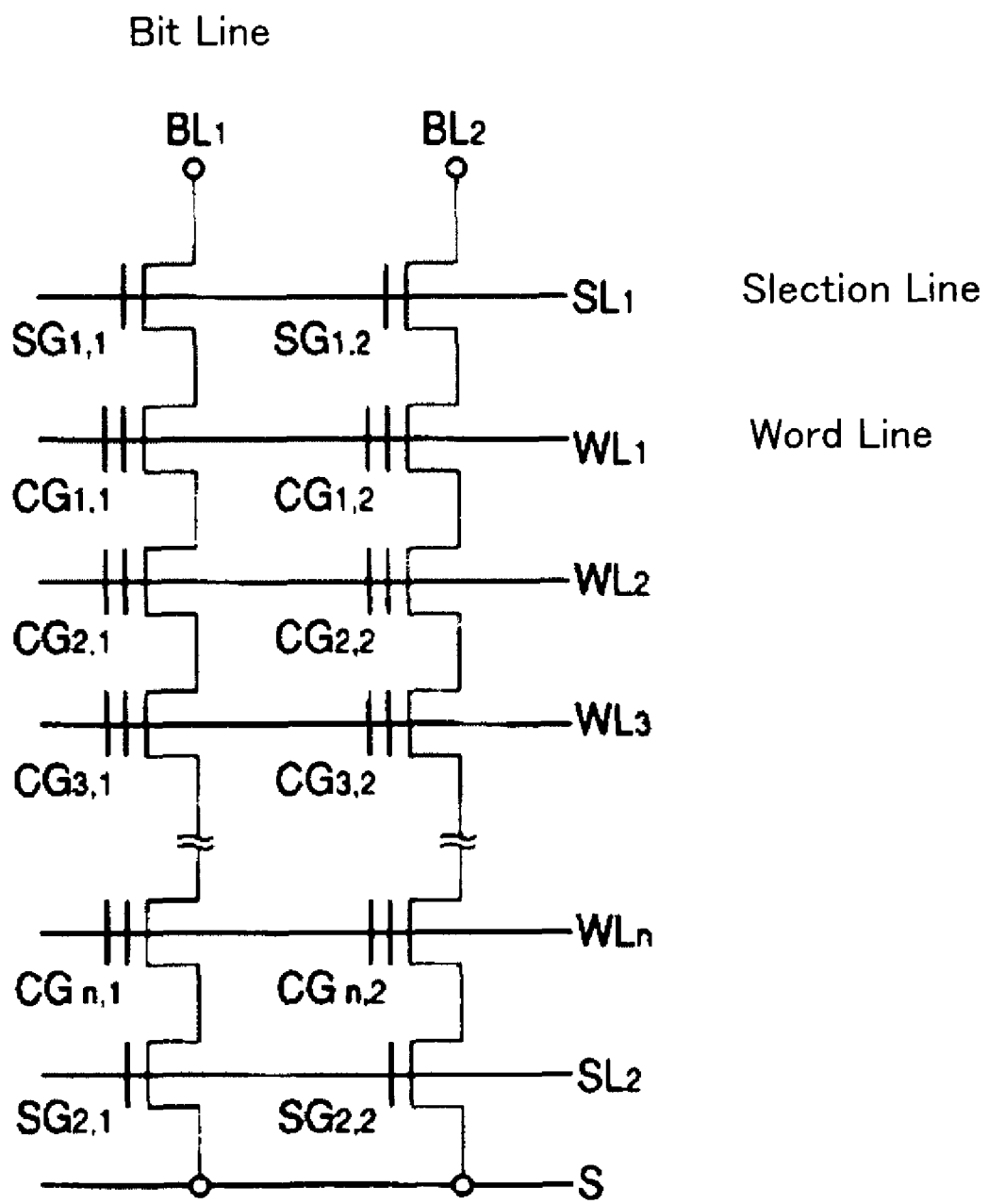
FIG. 2 is a circuit diagram showing the nonvolatile memory semiconductor device according to the first embodiment of the present invention.
Figure 3:
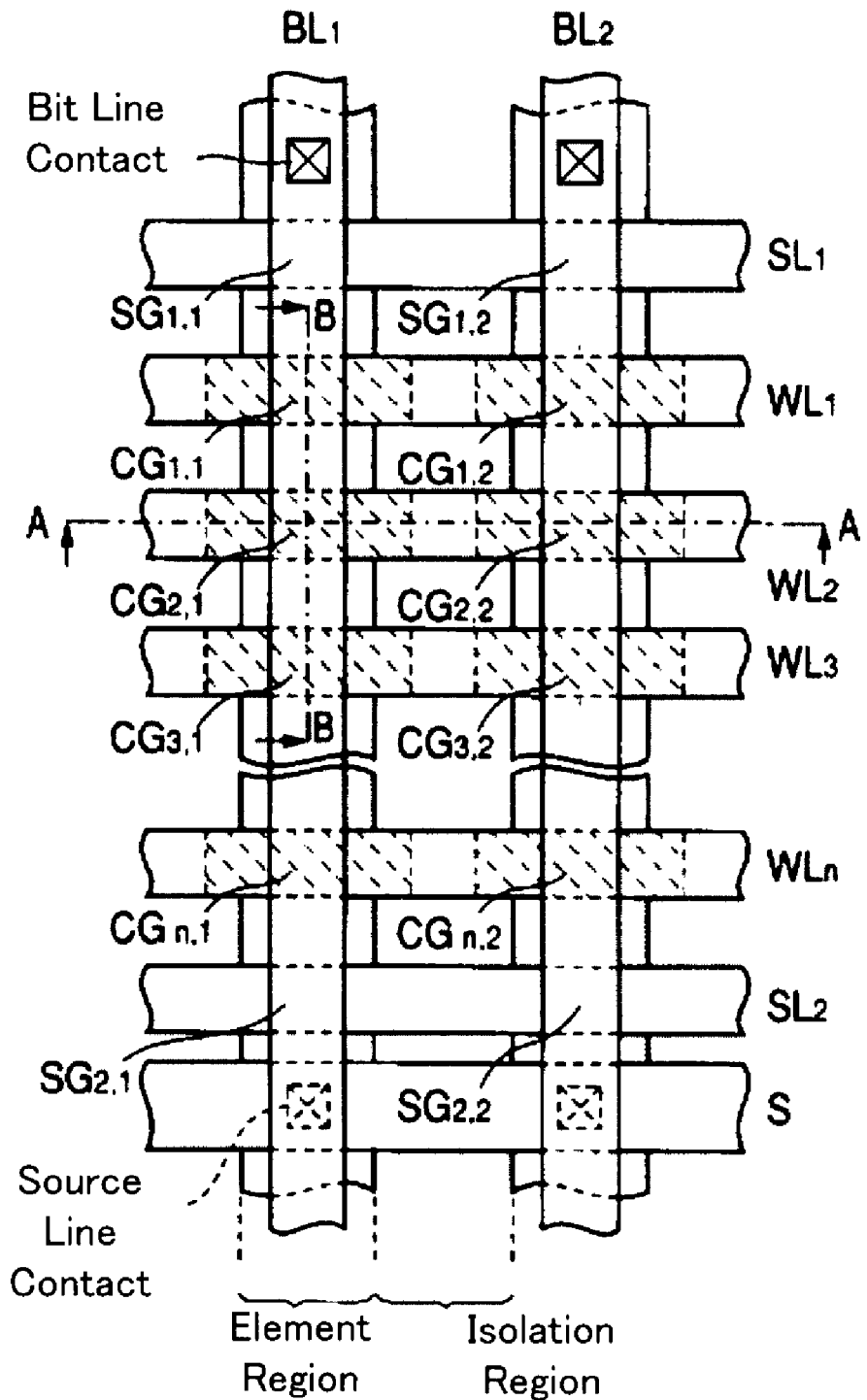
FIG. 3 is a plane view showing the nonvolatile memory semiconductor device according to the first embodiment of the present invention.
Figure 4:
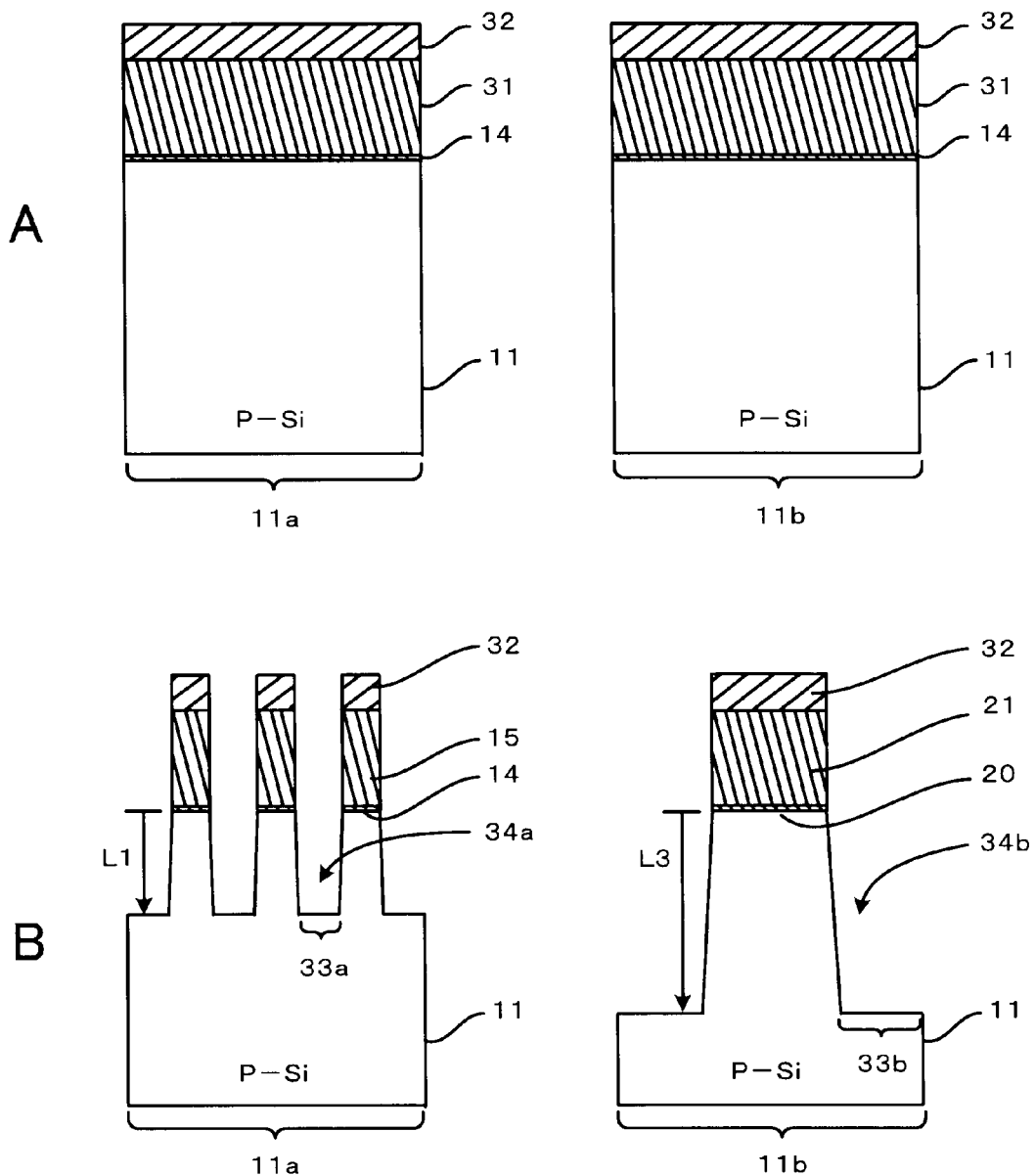
FIG. 4 is a cross-sectional view showing fabricating processes of the nonvolatile memory semiconductor device in order according to the first embodiment of the present invention.
Figure 5:
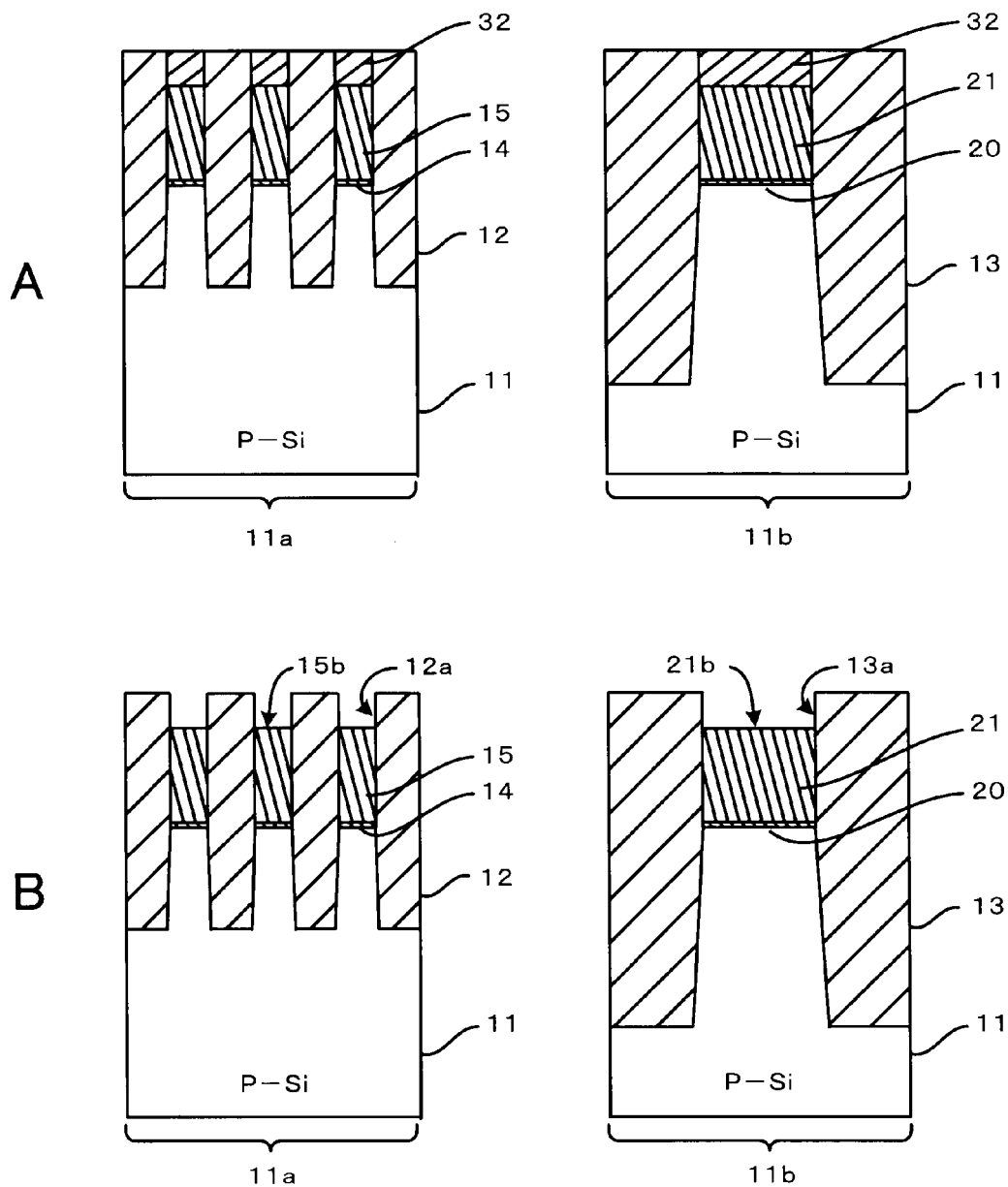
FIG. 5 is a cross-sectional view showing the fabricating processes of the nonvolatile memory semiconductor device in order according to the first embodiment of the present invention.
Figure 6:
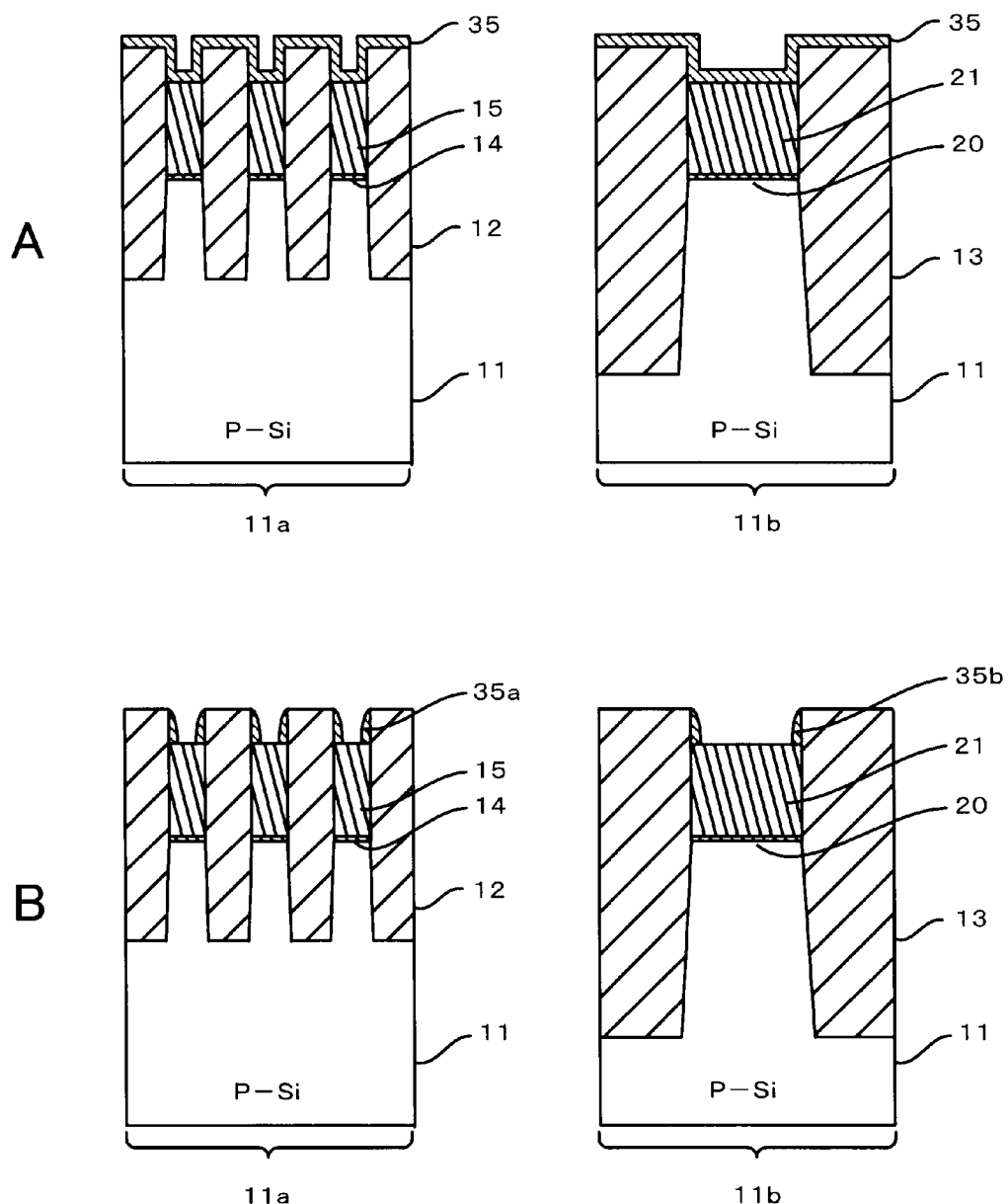
FIG. 6 is a cross-sectional view showing the fabricating processes of the nonvolatile memory semiconductor device in order according to the first embodiment of the present invention.
Figure 7:
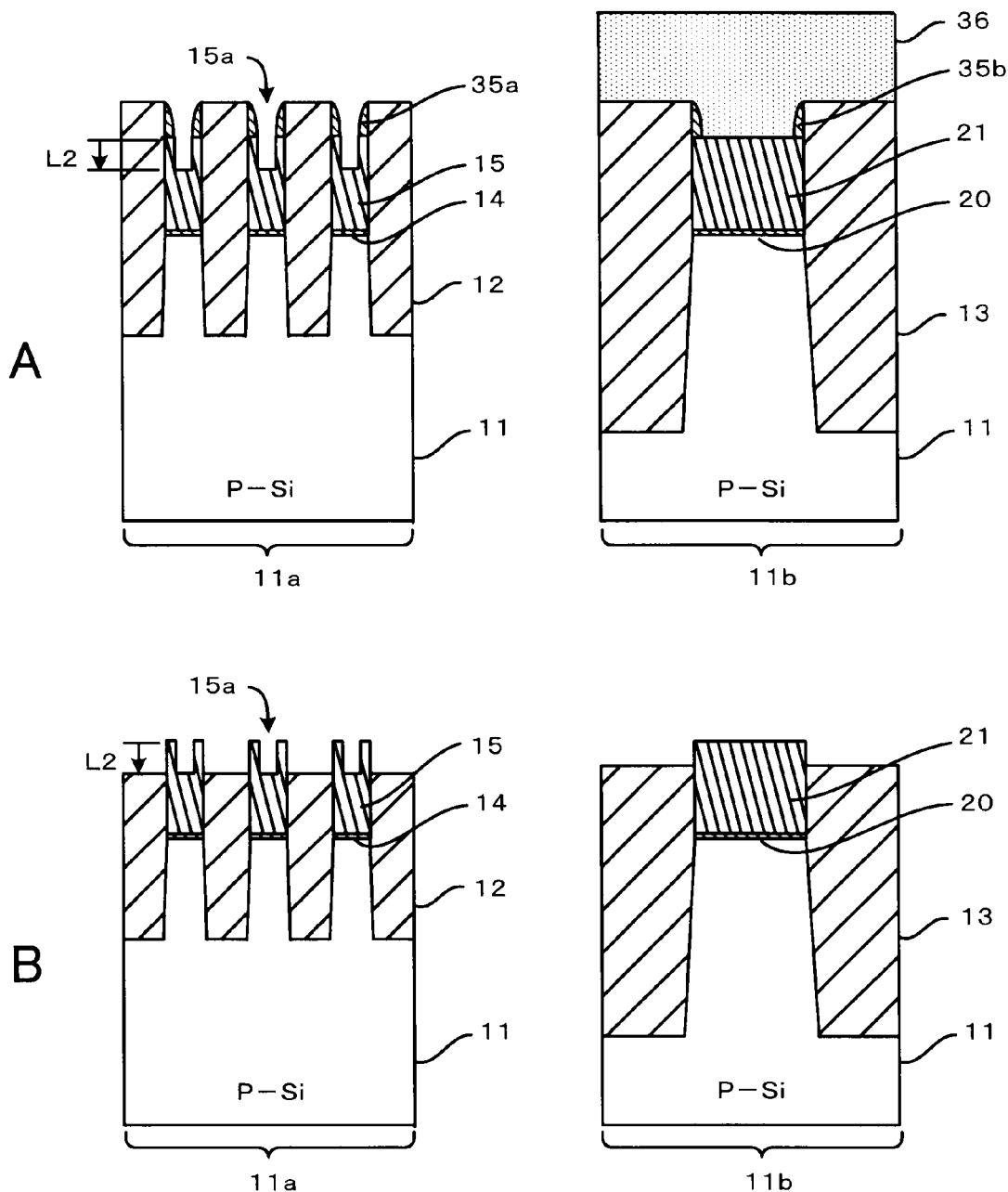
FIG. 7 is a cross-sectional view showing the fabricating processes of the nonvolatile memory semiconductor device in order according to the first embodiment of the present invention.
Figure 8:
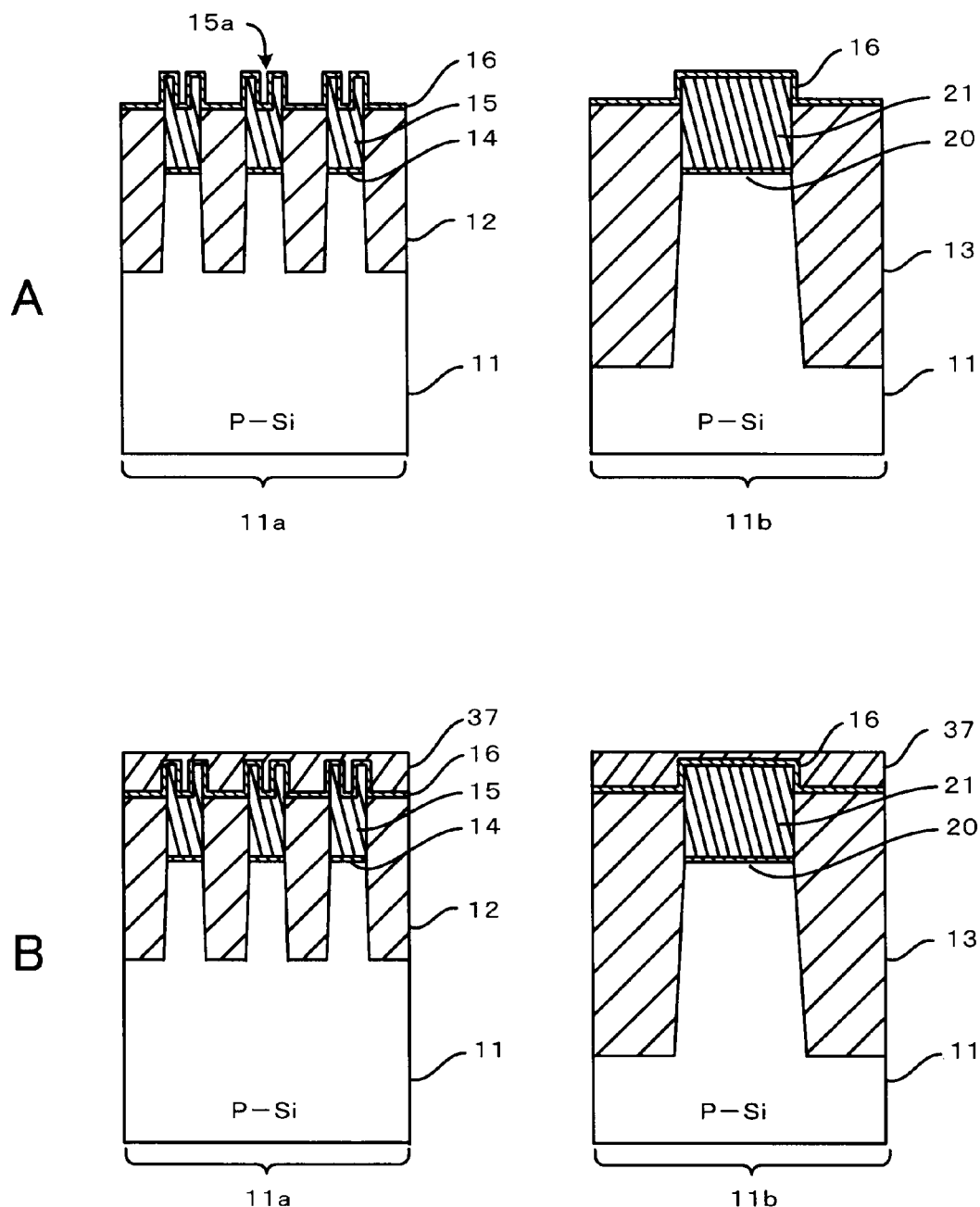
FIG. 8 is a cross-sectional view showing the fabricating processes of the nonvolatile memory semiconductor device in order according to the first embodiment of the present invention.
Figure 9:
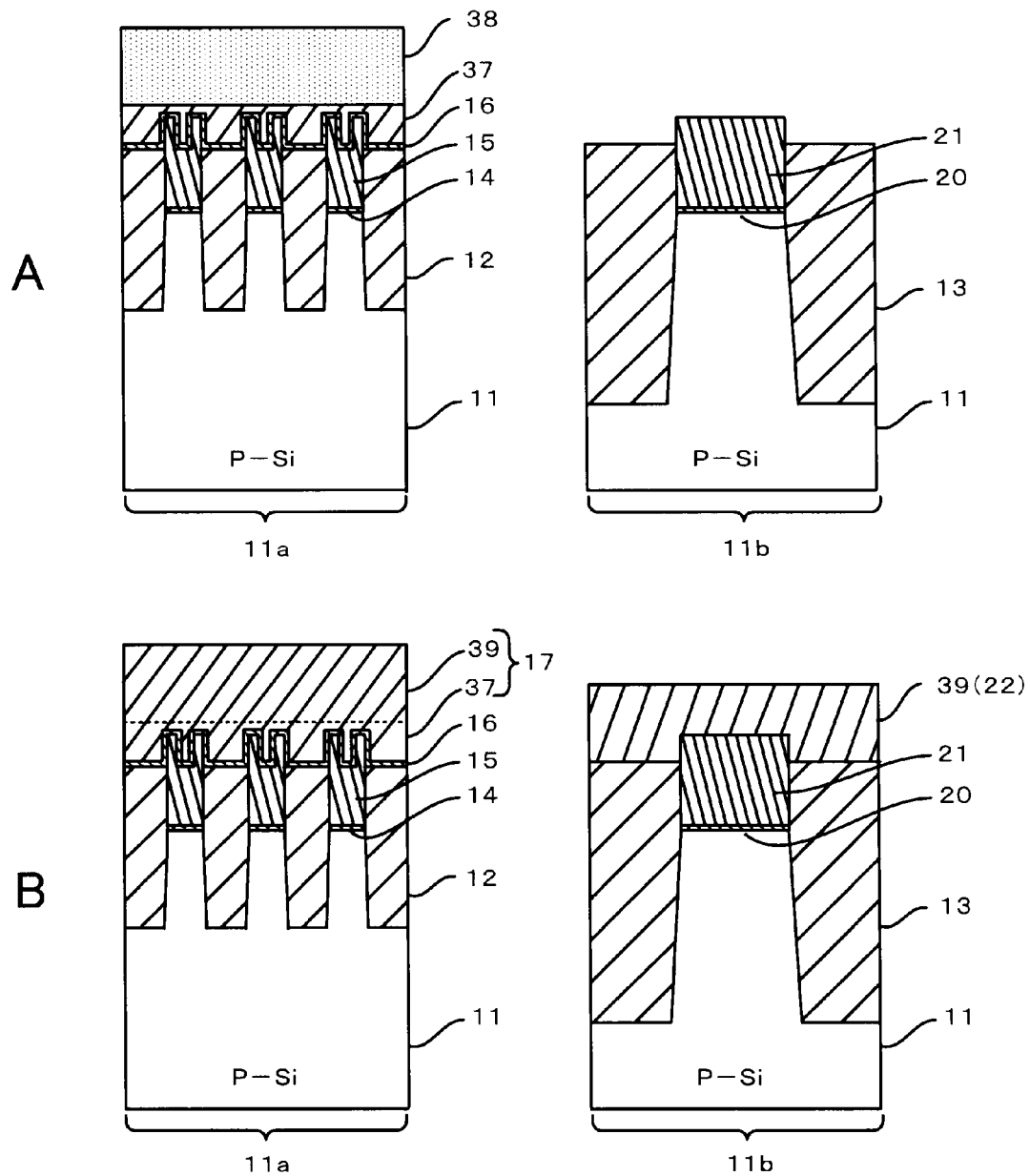
FIG. 9 is a cross-sectional view showing the fabricating processes of the nonvolatile memory semiconductor device in order according to the first embodiment of the present invention.

FIG. 1 is a nonvolatile memory semiconductor device according to a first embodiment of the present invention. FIG. 1A is a cross-sectional view along a word line direction showing a memory cell, FIG. 1B is a cross-sectional view along the word line direction showing a periphery circuit, FIG. 1C is a cross-sectional view along a bit line direction showing the memory cell and FIG. 1D is a cross-sectional view along the bit line direction showing the periphery circuit. FIG. 2 is a circuit diagram showing the nonvolatile memory semiconductor device according to the first embodiment of the present invention. FIG. 3 is a plane view showing the nonvolatile memory semiconductor device according to the first embodiment of the present invention. FIGS. 4-9 are cross-sectional views showing fabricating processes of the nonvolatile memory semiconductor device in order according to the first embodiment of the present invention.

This embodiment describes a NAND-type EEPROM as an example. The NAND-type cell is constituted with a plurality of cell transistors being serially connected in the non-volatile semiconductor memory device. Each of the cell transistors shares a source-drain diffusion layer with the adjoining cell transistor.

First, a memory cell array of a NAND-type EEPROM is explained using FIG. 2 and FIG. 3.

As shown in FIG. 2, the memory cell array of the NAND-type EEPROM is constituted with n-channel MOS transistors, for example, each of the NAND-type EEPROM having a stacked structure of a floating gate electrode and a control gate electrode in order. The NAND-type memory cell as a first column is constituted with memory transistors and selection NMOS transistors mentioned below. A plurality of memory transistors CG1.1, CG2.1, CG3.1 . . . CGn.1 are serially connected, a drain of one end memory transistor in the memory transistors is connected to a bit line BL1 by a bit line contact via a selection NMOS transistor SG 1.1, and a source of the other end memory transistor in the memory transistors is connected to line S by a source line contact via a selection NMOS transistor SG 2.1.

In similar fashion, a NAND-type memory cell as a second column is constituted with a plurality of memory transistors SG1.2, CG1.2, CG2.2, CG3.2 . . . CGn.2, SG2.2. A group of the NAND-type memory cell is configured as a plurality of the memory cell arrays.

As shown in FIG. 3, each of the transistors in the memory cell array is formed in a same well region of a semiconductor substrate and the control gate electrode of the memory transistors CG1.1, CG2.1, CG3.1 . . . , CGn.1 (CG1.2, CG2.2, CG3.2 . . . CGn.2) are serially configured to row direction approximately orthogonal to the bit line BL so as to constitute word lines WL1, WL2, . . . WLn.

Furthermore, the control gate electrodes of the selection transistors SG1.1 and SG1.2 are serially configured as similar as the control gate electrode of the memory transistors, respectively, to constitute selection lines SL1 and SL2.

As shown by hatching of broken lines in FIG. 3, the floating gate electrode of each memory cell is isolated in separation under the control gate electrode.

As shown in FIG. 1, a non-volatile semiconductor memory device 10 in this embodiment includes a memory cell region (first region) 11a and a periphery circuit region (second region) 11b formed on a main surface of a semiconductor substrate 11, for example, p-type silicon substrate (p-type well), a memory cell 10a are formed in the memory cell region 11a and a periphery circuit 10b is formed in a periphery circuit region 11b. The periphery circuit 10b writes in data to the memory cell 10a and read out the data from the memory cell 10a.

The memory cell 10a includes a cell transistor which is electrically isolated by a first insulation isolation layer 12 constituting a shallow trench isolation (STI). The periphery circuit 10b includes a periphery circuit transistor which is electrically isolated by a second insulation isolation layer 13 constituting STI.

The cell transistor includes a tunnel oxide film 14 (first gate insulator), a floating gate electrode 15, an ONO film (SiO$_2$/SiN/SiO$_2$ film) 16, a control gate electrode 17 and impurity diffusion layers 18 and 19. The tunnel oxide film 14 (first gate insulator) is formed in the memory cell region 11a. The floating gate electrode 15 constituting a first gate electrode is formed on the tunnel oxide film 14 and has a first concave portion 15a at an upper portion thereof. The ONO film (SiO$_2$/SiN/SiO$_2$ film) 16 constituting a second gate insulator is formed on the floating gate electrode 15 and conformally covers an upper portion of the floating gate electrode 15. The control gate electrode 17 constituting a second gate electrode is embedded in the first concave portion 15a and is formed on the ONO film 16. The impurity diffusion layers 18 and 19 with the reverse conductive type to the semiconductor substrate 11 are formed to sandwich a channel region in the semiconductor substrate 11 under the floating gate electrode 15.

The first insulation isolation layer 12 is embedded in the memory cell region 11a extend from the semiconductor substrate 11 to the floating gate electrode 15. The impurity diffusion layers 18 and 19 are the source and the drain as the cell transistor.

The periphery circuit transistor includes a third gate insulator 20, a first conductive layer 21, a second conductive layer 22 and impurity diffusion layers 23 and 24. The third gate insulator 20 is formed in the periphery circuit region 11b. The first conductive layer 21 is formed on the third gate insulator 20 and a height of the first conductive layer 21 from the semiconductor substrate 11 is equal to a height of the floating gate electrode 15 from the semiconductor substrate 11. The second conductive layer 22 is formed to contact with an upper surface of the first conductive layer 21. The impurity diffusion layers 23 and 24 with the reverse-conductive type to the semiconductor substrate 11 are formed to sandwich a channel region under the first conductive layer 21.

The second insulation isolation layer 12 is embedded in the periphery circuit region 11b extend from the semiconductor substrate 11 to the first conductive film 21. The first conductive layer 21 and the second conductive layer 22 are electrically connected and constitute a gate electrode of the periphery circuit transistor. The impurity diffusion layers 23 and 24 are the source and the drain as the periphery circuit transistor.

A silicide film (not illustrated), a tungsten silicide film for example, is formed on the control gate electrode 17 and the second conductive film 22 for lowering resistance of the gate electrode. An insulator (not illustrated) being a TEOS (Tetra Ethyl Ortho Silicate) film, for example, is formed on the tungsten-silicide film.

The third gate insulator 20 is a film with the same material as the tunnel oxide film 14 being an oxy-nitride film, for example. The first conductive film 21 is a film with the same material as the floating gate electrode 15 being a poly-silicon film, for example. The second conductive film 22 is a film with the same material as the control gate electrode 17 being a poly-silicon film, for example.

A silicon oxide film (not illustrated) is formed on side-walls of the floating gate electrode 15, the control gate electrode 17, the first conductive film 21, the second conductive film 22 and the tungsten-silicide film in the bit line direction for recovering processing damages or the like by thermal oxidation.

A surface area of the upper portion of the floating gate electrode 15 by a surface area of a side-wall of the first concave portion 15a formed on an upper portion of the floating gate electrode 15 compared with a surface area without forming the first concave portion 15a. Electrostatic capacity Cb of the ONO film 16 is determined by a total of a size of the ONO film formed on the upper surface of the floating gate electrode 15, a size of the ONO film formed on the side-wall of the floating gate electrode 15 and a size of the ONO film formed on an inner area of the first concave portion 15a being a side-wall and a bottom surface of the first concave portion 15a.

Consequently, coupling ratio Cr being equal to Cb/(Ca+Cb) determined by electrostatic capacity Ca of the tunnel oxide film 14 and electrostatic capacity Cb of the ONO film 16 can be higher than a conventional structure without forming the first concave portion 15a. Accordingly, coupling ratio Cr being equal to Cb/(Ca+Cb) can retain as high, while the floating gate electrode 15 becomes thinner by shrinking. Cell characteristic performance such as programming characteristic on memory information to the memory cell 10a, erasing characteristic on memory information to the memory cell 10a or the like can be improved.

Next, a method for fabricating the non-volatile semiconductor memory device 10 is explained by using FIG. 4-FIG. 9. As shown in FIG. 4A, a tunnel oxide film as the first gate insulator 14, for example, a poly-silicon film as a first gate electrode material film 31, for example, a silicon nitride film as a cap insulator 32, for example, on the first gate electrode material film 31 are formed in the memory cell region 11a and the periphery circuit region 11b of the semiconductor substrate 11 using well-known processes.

Actually, a silicon oxide film of 4-20 nm thickness, for example, is formed on the p-type silicon substrate (p-type well) 11 by thermal oxidation. Next, the silicon oxide film is treated as nitriding by using $NH_3$ gas. Furthermore, the silicon oxide film is treated as oxidizing to transform with an oxy-nitride film. The oxy-nitride film acts as the first gate insulator 14 and is generally called the tunnel oxide film. The poly-silicon film 31, the silicon nitride film 32 and a silicon oxide film (not illustrated) are formed on the first gate insulator 14 by CVD (Chemical Vapor Deposition) in order. The poly-silicon film 31 is the first gate electrode material film constituting the floating gate electrode 15 and the first conductive film 21.

As shown in FIG. 4B, the cap insulator 32, the first gate electrode material film 31 and the tunnel oxide film 14 of a first element isolation region 33a in the memory cell region 11a are etched using a mask (not illustrated) having a first opening to form the first gate electrode 15 being isolated. The semiconductor substrate 11 is etched to a first depth L1 so as to form a first isolation groove 34a.

In similar fashion, the silicon nitride film 32, the poly-silicon film 21, the tunnel oxide film 20 of a second element isolation region 33b in the periphery circuit region 11b are etched using a mask (not illustrated) having a second opening to form the first conductive film 21 being isolated. The semiconductor substrate 11 is etched to a third depth L3 so as to form a second isolation groove 34b.

Actually, a silicon oxide film (not illustrated) is etched using a resist film (not illustrated) having a first opening with a stripe shape as a mask by RIE (Reactive Ton Etching) using a florine-based gas. The silicon nitride film 32 is etched using the silicon oxide film as a mask by RIE using a florine-based gas.

Next, the poly-silicon film 31 and the tunnel oxide film 14 are etched using the silicon nitride film 32 and the silicon oxide film (not illustrated) as a mask by RIE. The poly-silicon film 31 is etched by RIE using a chlorine-based and florine-based gas, for example, an $HBr/CF_4/Cl_2$ gas.

Next, the semiconductor substrate 11 is anisotropically etched using the poly-silicon film 31 as a mask by RIE using a chlorine-based and florine-based gas to form the first isolation groove 34a.

In the processing steps mentioned above, an element region (not illustrated) having the stripe-shape patterns are formed. The poly-silicon film being first gate electrode material film 31 is also etched as same as the element region, however, the poly-silicon film is not isolated as each cell transistor of the memory cell in this stage.

As shown in FIG. 5A, a silicon oxide film (not illustrated) is formed insides of the first isolation grooves 34a and the second isolation grooves 34b by thermal oxidation. Subsequently, a silicon oxide film (first insulator) is formed on the silicon nitride film 32 by CVD to be embedded into the first isolation groove 34a and the second isolation groove 34b. Excess silicon oxide film is removed by CMP (Chemical Mechanical Polishing) to expose the silicon nitride film 32 so that the first insulation isolation layer 12 and the second insulation isolation layer 13 are formed.

As shown in FIG. 5B, the silicon nitride film 32 is etched by thermal phosphoric acid to expose an upper surface 15b of the floating gate electrode 15 and a side-wall 12a of the first insulation isolation layer 12. Simultaneously, an upper surface 21b of the first conductive layer 21 and a side-wall 13a of the second insulation isolation layer 13 are exposed.

As shown in FIG. 6A, a silicon oxide film 35 (second insulator) is conformally formed on the first insulation isolation layer 12 and the floating gate electrode 15 in the memory cell region 11a and the second insulation isolation layer 13 and the first conductive layer 21 the periphery circuit region 11b by CVD.

As shown in FIG. 6B, the silicon oxide film 35 is anisotropically etched by RIF to form a first side-wall film 35a on the side-wall 12a of the first insulation isolation layer 12 in the memory cell region 11a. Simultaneously, a second side-wall film 35b is formed on the side-wall 13a of the second insulation isolation layer 13 in the periphery circuit region 11b. The second side-wall film 35b is unnecessary to be removed in processing steps mentioned below. Therefore, the second side-wall film 35b may be leaved in this stage.

As shown in FIG. 7A, the periphery circuit region 11b is protected by a resist film 36, subsequently an upper portion of the floating gate electrode 15 in the memory cell region 11a is etched to a second depth L2 by RIE using the first side-wall film 35a as a mask to form a first concave portion 15a in self-align.

As shown in FIG. 7B, after removing the resist film 36 on the periphery circuit region 11b, the first side-wall film 35a and the second side-wall film 35b, and the first insulation isolation layer 12 and the second insulation isolation layer 13 is etched to a depth at a bottom surface of the first concave portion 15a to expose an upper portion of the floating gate electrode 15 and an upper portion of the first conductive layer 21.

As shown in FIG. 8A, the ONO film 16, for example, is conformally formed on the first insulation isolation layer 12 and the upper portion of the floating gate electrode 15 in the memory cell region 11a about 15 nm thickness by CVD. Simultaneously, the ONO film 16 is conformally formed on the second insulation isolation layer 13 and the upper portion of the first conductive layer 21 in the periphery circuit region 11b. The ONO film 16 in the periphery circuit region 11b is unnecessary to be removed in processing steps mentioned below. Therefore, the ONO film 16 in the periphery circuit region 11b may be leaved in this stage.

As shown in FIG. 8B, for protecting the ONO film 16, a poly-silicon film 37 is formed to be embedded into the first concave portion 15a. The poly-silicon film 37 is a first layer of a conductive film in the control gate electrode 17 stacked with two conductive films. Simultaneously, the poly-silicon film 37 is formed on the periphery circuit region 11b. The poly-silicon film 37 in the periphery circuit region 11b is unnecessary to be removed in processing steps mentioned below. Therefore, the poly-silicon film 37 in the periphery circuit region 11b may be leaved in this stage.

As shown in FIG. 9A, after protecting the memory cell region 11a by a resist film 3B, the poly-silicon film 37 in the periphery circuit region 11b is etched by RIE using the ONO film 16 as a stopper. Next, the ONO film 16 is removed by isotropic etching, for example, wet etching or CDE (Chemical Dry Etching) to expose the upper portion of the first conductive layer 21 again.

As shown in FIG. 9B, after removing the resist film 38, a poly-silicon film 39 is formed on the poly-silicon film 37 in the memory cell region 11a and the periphery circuit region 11b by CVD.

Furthermore, the floating gate electrode 15 and the control gate electrode 17 constituting a gate electrode of the cell transistor is etched by RIE, for example. Further, the first conductive layer 21 and the second conductive layer 22 constituting a gate electrode in the periphery circuit transistor are etched.

A stacked layer with the poly-silicon film 37 and the poly-silicon film 39 in order acts as the control gate electrode 17 in the memory cell region 11a. The poly-silicon film 37 and the poly-silicon film 39 are the second gate electrode material film. In the periphery circuit region 11b, the poly-silicon film 39 contacts with the upper surface of the first conductive layer 21 to electrically connect and to act as the second conductive layer 22.

Next, N-type impurity diffusion layers 18 and 19 is formed by n-type impurities, for example arsenic, are ion-implanted into an element region of the memory cell region 11a to self-align with the floating gate electrode 15 and the control gate electrode 17, and a subsequent thermal annealing. The N-type impurity diffusion layers 18 and 19 having the reverse conductive type to the semiconductor substrate 11 are formed to sandwich a portion of the semiconductor substrate 11 under the floating gate electrode 15 and the control gate electrode 17. Simultaneously, N-type impurity diffusion layers 23 and 24 is formed by n-type impurities are ion-implanted into the element region of the periphery circuit region 11b to self-align with the first conductive layer 21 and the second conductive layer 22 and a subsequent thermal annealing. The N-type impurity diffusion layers 23 and 24 having the reverse conductive type to the semiconductor substrate 11 are formed to sandwich a portion of the semiconductor substrate 11 under the first conductive layer 21 and the second conductive layer 22.

As mentioned above, the non-volatile semiconductor memory device 10 having the memory cell region 11a and the periphery circuit region 11b is obtained as shown in FIG. 1. The memory cell region 11a includes the cell transistors having the floating gate electrode 15 with the first concave portion 15a, the control gate electrode 17 and the first insulation isolation layer 12. The periphery circuit region 11b includes the periphery circuit transistors having the gate electrode with the first conductive layer 21, the second conductive layer 22 and the second insulation isolation layer 13.

As mentioned above, in this embodiment, the first side-wall film 35a is formed on the side-wall 12a of the first insulation isolation layer 12 and the first concave portion 15a is formed on the upper portion of the floating gate electrode 15 with self-align using the first side-wall film 35a as the mask.

As a result, the first concave portion 15a being finer can surely formed on the upper portion of the first gate electrode 15 being conventionally fine. Accordingly, the non-volatile semiconductor memory device and the fabrication method including the cell transistor having high coupling ratio is obtained.

Moreover, the protecting process by the resist film 36 to prevent the concave portion from being formed on the upper portion of the first conductive layer 21 is easily performed in the periphery circuit region 11b. Furthermore, the removing processes of the ONO film 16 and the poly-silicon film 37 formed on the first conductive layer 21 and the second insulation isolation layer 13 are easily performed in the periphery circuit region 11b. As a result, the fabrication processes becomes greatly lowering throughput.

Furthermore, the processing steps are simplified and improving of characteristic faulty by miss alignment of lithography compared with forming the first concave portion 15 using lithography.

This embodiment explains on a case which the first insulation isolation layer 12 and the second insulation isolation layer 13 are etched to the second depth L2 at the bottom portion of the first concave portion, however, the depth may be etched to deeper than the bottom portion of the first concave portion 15a.

Figure 10:
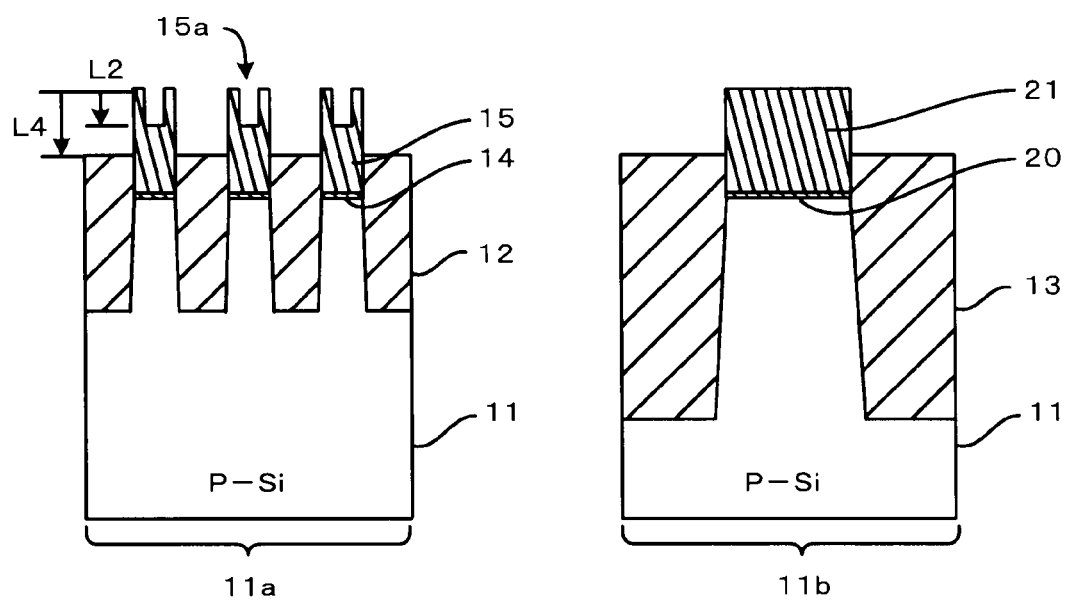
FIG. 10 is a cross-sectional view showing the fabricating processes of the nonvolatile memory semiconductor device in order according to the first embodiment of the present invention.

FIG. 10 shows a cross-sectional view in a state which the first insulation isolation layer and the second insulation isolation layer are over-etched to a deeper depth than the second depth at the bottom portion of the first concave portion. As shown in FIG. 10, the first insulation isolation layer 12 and the second insulation isolation layer 13 are over-etched to drop down to a depth L4 which is deeper than the second depth L2 at the bottom portion of the first concave portion 15a.

In this approach, corresponding to a value of the dropped between the depth L4 and the depth L2, the surface area of the upper portion of the floating gate electrode 15 is increased so that electrostatic capacity Cb of the ONO film 16 is also increased. As a result, coupling ratio Cr being equal to Cb/(Ca+Cb) defined by electrostatic capacity Ca of the tunnel oxide film 14 and electrostatic capacity Cb of the ONO film 16 is higher. Accordingly, there is an advantage that performance of the cell characteristic such as programming characteristic of the memory information to memory cell 10a, erasing characteristic of the memory information to memory cell 10a or the like can be further improved.

This embodiment explains on a case which the third depth L3 of the second insulation isolation groove 34b is deeper than the first depth L1 of the first isolation groove 34a, however, the third depth L3 may be equal to the first depth L1. The method mentioned above has an advantage that the second insulation isolation groove 34b and the first isolation groove 34a can be simultaneously formed.

This embodiment explains a case which the first gate electrode material film 31 is the poly-silicon film; however, an amorphous-silicon film may be used as the first gate electrode material film 31. This embodiment explains a case which the second gate electrode material films 37 and 39 are the poly-silicon films; however, amorphous-silicon films may be used as the second gate electrode material films 37 and 39.

This embodiment explains a case which the second gate insulator 16 is the ONO film, however, an aluminum oxide ($Al_2O_3$) film or a silicon oxide mono-layer film may be used as the second gate insulator 16.

Furthermore, this embodiment explains a case which the non-volatile semiconductor memory device 10 is a NAND-type EEPROM, however, a NOR-type EEPROM may be applied to the non-volatile semiconductor memory device 10.

Second Embodiment

Secondly, according to a second embodiment of the present invention, a nonvolatile memory semiconductor device and fabricating processes of the nonvolatile memory semiconductor device are explained with reference to FIGS. 11-14.

Figure 11:
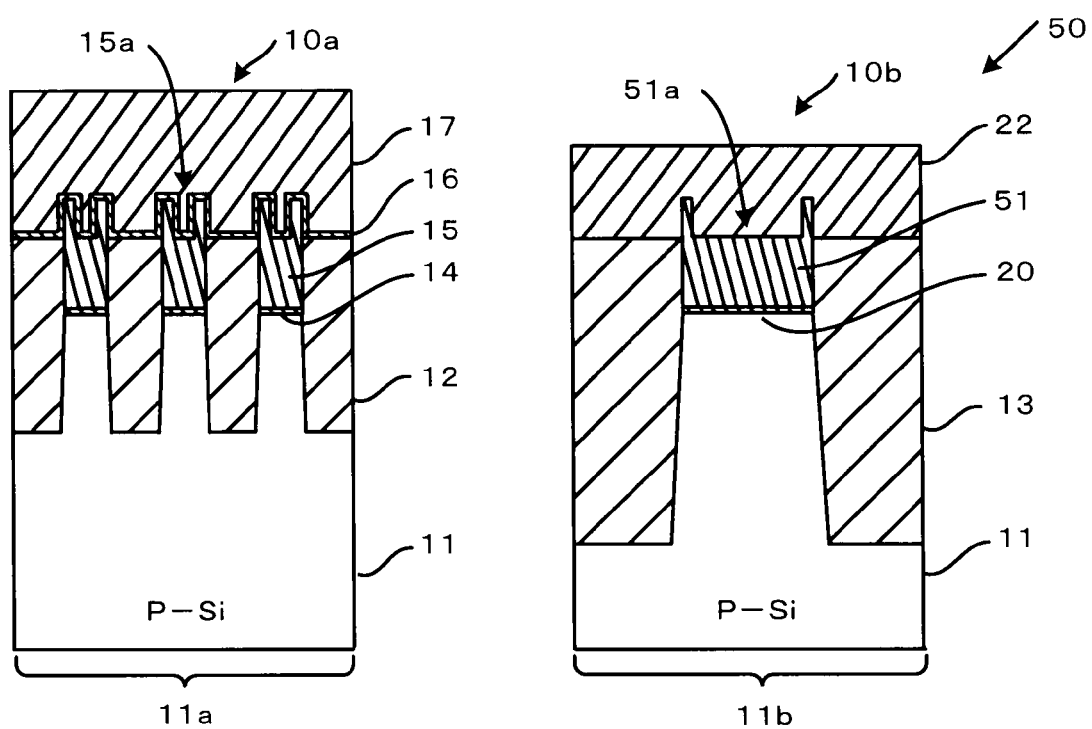
FIG. 11 is a nonvolatile memory semiconductor device according to a second embodiment of the present invention.
Figure 12:
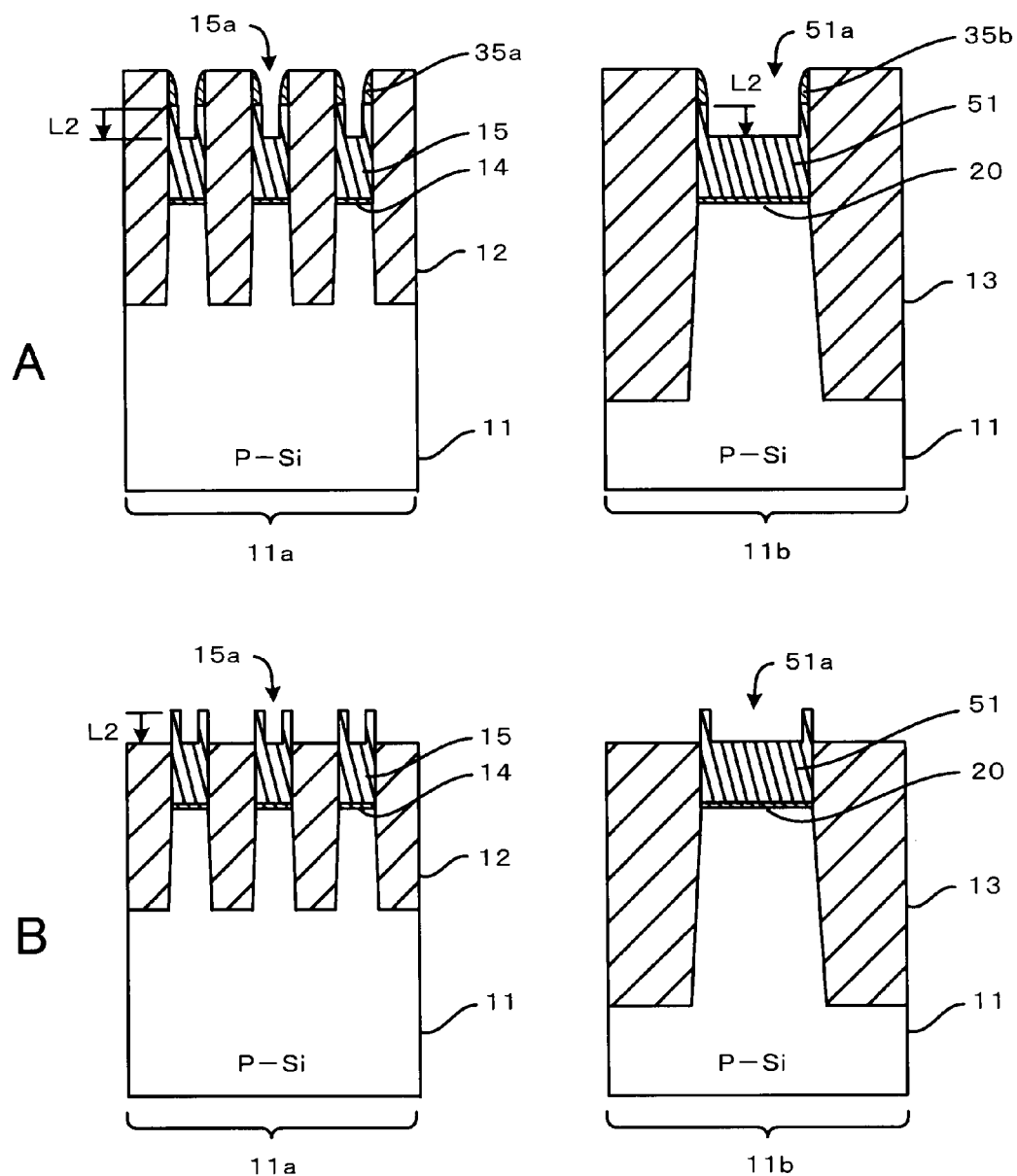
FIG. 12 is a cross-sectional view showing a main portion of fabricating processes of the nonvolatile memory semiconductor device in order according to the second embodiment of the present invention.
Figure 13:
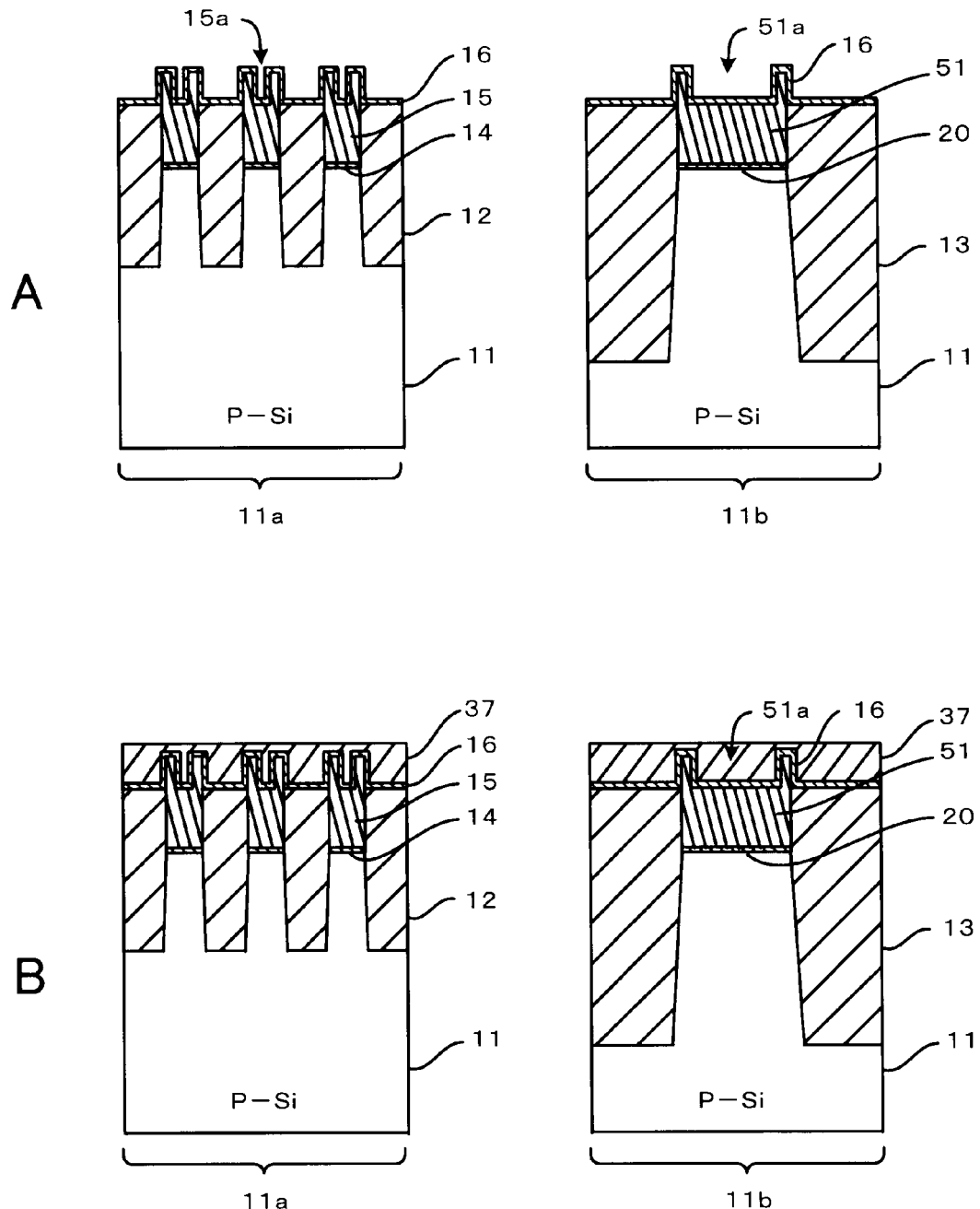
FIG. 13 is a cross-sectional view showing a main portion of the fabricating processes of the nonvolatile memory semiconductor device in order according to the second embodiment of the present invention.
Figure 14:
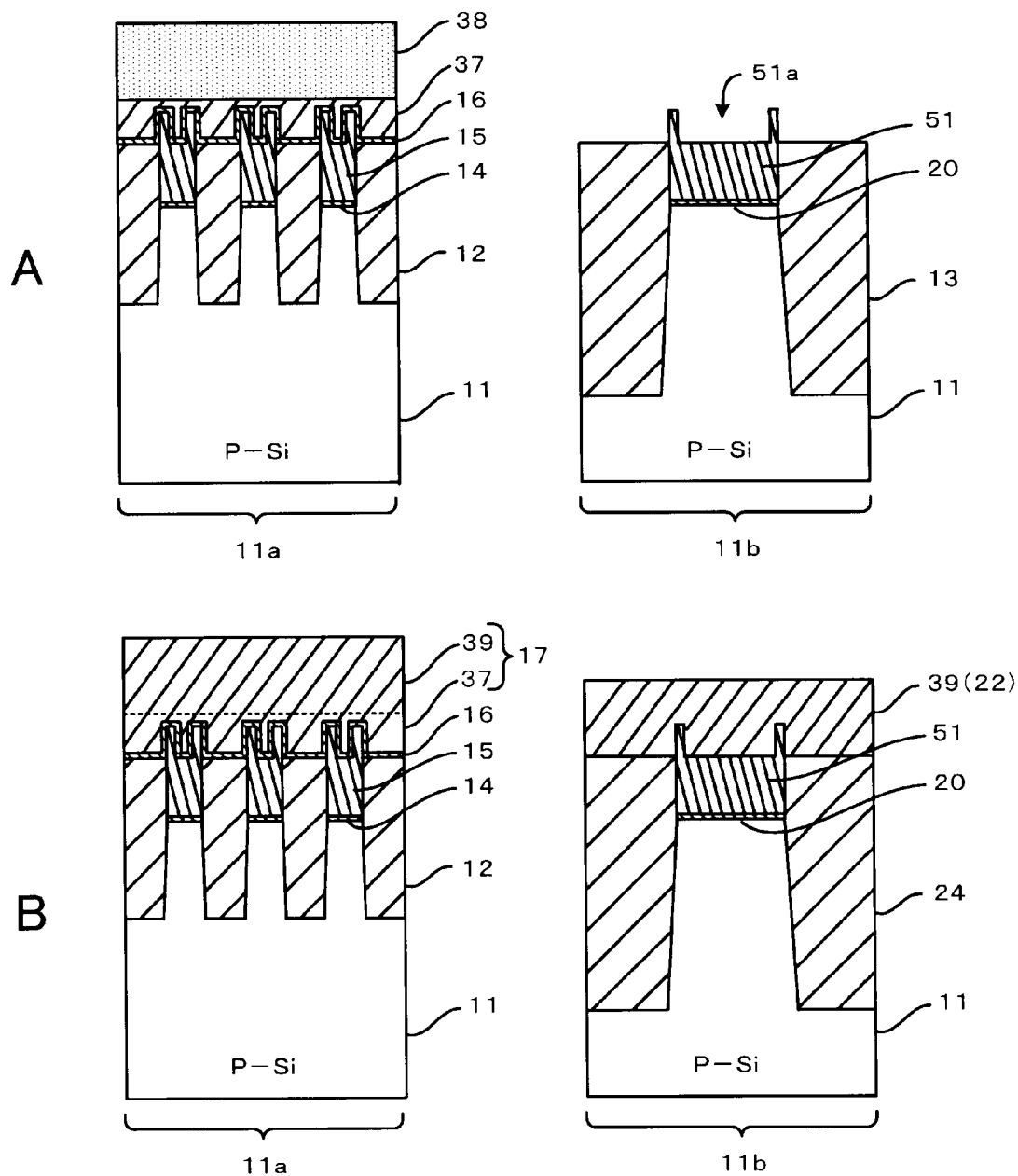
FIG. 14 is a cross-sectional view showing a main portion of the fabricating processes of the nonvolatile memory semiconductor device in order according to the second embodiment of the present invention.

FIG. 11 is a nonvolatile memory semiconductor device according to a second embodiment of the present invention. FIG. 12 is a cross-sectional view showing a main portion of fabricating processes of the nonvolatile memory semiconductor device in order according to the second embodiment of the present invention. FIG. 13 is a cross-sectional view showing a main portion of the fabricating processes of the nonvolatile memory semiconductor device in order according to the second embodiment of the present invention. FIG. 14 is a cross-sectional view showing a main portion of the fabricating processes of the nonvolatile memory semiconductor device in order according to the second embodiment of the present invention.

It is to be noted that the same or similar reference numerals are applied to the same or similar parts and elements throughout the drawings, and the description of the same or similar parts and elements will be omitted or simplified.

The second embodiment is different from the first embodiment at a point, for example, that a concave portion is formed on an upper portion of a periphery circuit region in a first conductive layer.

As shown in FIG. 11, a non-volatile semiconductor memory device 50 in this embodiment includes first conductive layer 51 having a second concave portion 51a in a periphery circuit region 11b.

Next, it is explained on a fabrication method of the non-volatile semiconductor memory device 50. First, as similar to FIG. 4-FIG. 6, the first side-wall film 35a is formed on the side-wall 12a of the first insulation isolation layer 12, and the second side-wall film 35b is formed on the side-wall 13a of the second insulation isolation layer 13.

As shown in FIG. 12A, an upper portion of the floating gate electrode 15 is an isotropically etched to the second depth L2 by RIE using the first side-wall film 35a as a mask to form the first concave portion 15a in self-align. Simultaneously, an upper portion of the first conductive layer 21 is etched to the second depth L2 using the second side-wall film 35b as a mask to form the second concave portion 51a in self-align.

As shown in FIG. 12B, the first side-wall film 35a and the first insulation isolation layer 12 is etched to a depth at a bottom surface of the first concave portion 15a to expose the upper portion of the floating gate electrode 15. Simultaneously, the second side-wall film 35b and the first insulation isolation layer 13 is etched to a depth at a bottom surface of the first concave portion 15a to expose the upper portion of the first conductive layer 51.

As shown in FIG. 13A, the ONO film 16, for example, is comformally formed on the upper portion of the floating gate electrode 15 and the first insulation isolation layer 12 by CVD about 15 nm thickness. Here, the ONO film 16 is comformally formed on the upper portion of the first conductive layer 51 and the second insulation isolation layer 13. The ONO film 16 is unnecessary in processing steps mentioned below. Therefore, the ONO film 16 may be leaved in this stage.

As shown in FIG. 13B, for protecting the ONO film 16, the poly-silicon film 37 is formed to be embedded into the first concave portion 15a. Here, the poly-silicon film 37 is formed on the periphery circuit region 11b. The poly-silicon film 37 is unnecessary in processing steps mentioned below. Therefore, the poly-silicon film 37 may be leaved in this stage.

As shown in FIG. 14A, after protecting the memory cell region 11a using the resist film 38, the poly-silicon film 37 in the periphery circuit region 11b is etched using the ONO film 16 as a stopper by RIE. Next, an upper portion of the ONO film 16 on the first conductive layer 51 and the second insulation isolation layer is removed by isotropic etching 13 to expose the upper portion of the first conductive layer 51 again.

As shown in FIG. 14B, after removing the resist film 38, the poly-silicon film 39 is formed on the poly-silicon film 37 in the memory cell region 11a by CVD. Simultaneously, the poly-silicon film 39 is formed on the periphery circuit region 11b to be embedded into the second concave portion 51a. As the poly-silicon film 39 is formed to contact with an upper surface of the first conductive layer 51 having the second concave portion 51a, the poly-silicon film 39 has a flat surface and has not the second concave portion to retain electrical characteristic as the same as the first conductive layer 21.

As mentioned above, in this embodiment, the second concave portion 51a on the upper of the portion first conductive layer 51 is simultaneously formed with the first concave portion 15a.

In this fashion, the processes of protecting the first region 11b using the resist film 36 and removing the resist film 36 as shown in FIG. 7A is not necessary as the processing steps so that an advantage of shortening the processing steps is obtained.

Here, this embodiment explains a case which the first insulation isolation layer 12 and the second insulation isolation layer 13 are etched to the second depth L2 at the bottom portion of the first concave portion 15a. As the same as FIG. 10, the first insulation isolation layer 12 and the second insulation isolation layer 13 may be etched deeper than the bottom portion of the first concave portion 15a.

Figure 15:
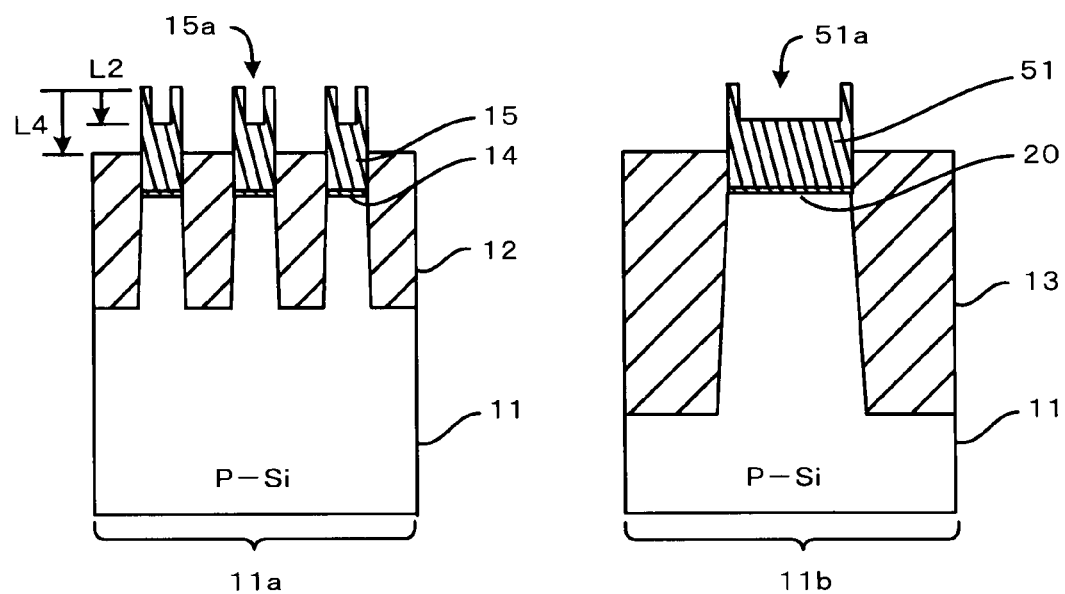
FIG. 15 is a cross-sectional view showing a main portion of the fabricating processes of the nonvolatile memory semiconductor device in order according to the second embodiment of the present invention.

FIG. 15 is a cross-sectional view in a state which the first insulation isolation layer and the second insulation isolation layer are over-etched to deeper than the second depth at the bottom portion of the first concave portion. As shown in FIG. 15, the first insulation isolation layer 12 and the second insulation isolation layer 13 are over-etched to a depth L4 which is deeper than the depth L2 reaching the bottom portion of the first concave portion 15a.

Third Embodiment

Next, according to a third embodiment of the present invention, a nonvolatile memory semiconductor device and fabricating processes of the nonvolatile memory semiconductor device are explained with reference to FIGS. 16-17.

Figure 16:
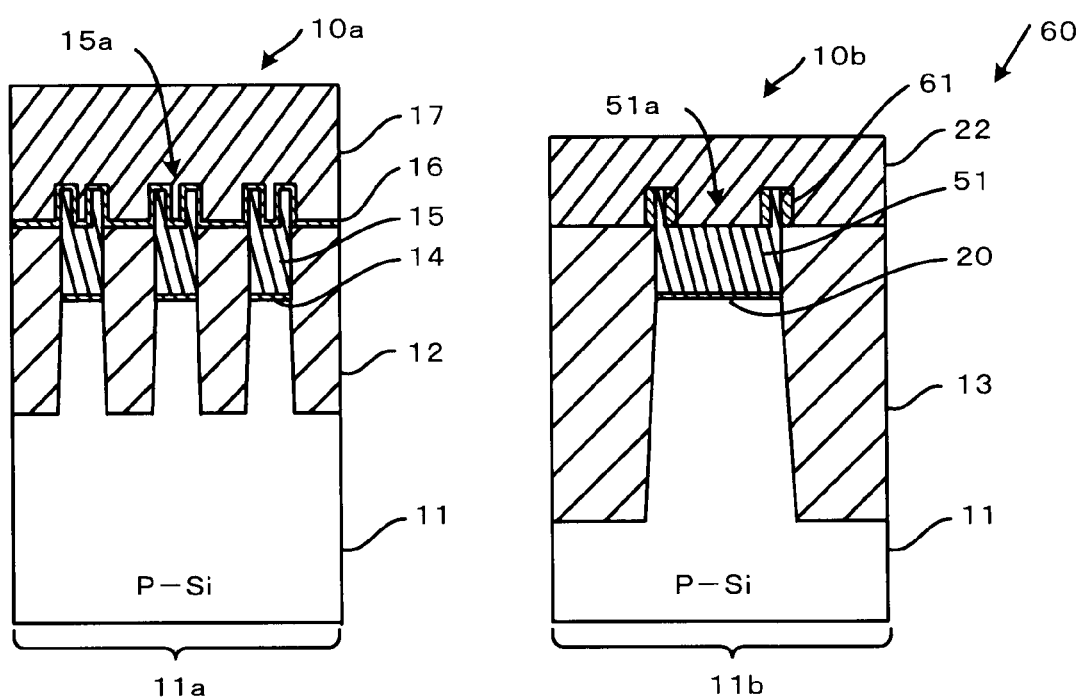
FIG. 16 is a nonvolatile memory semiconductor device according to a third embodiment of the present invention.

FIG. 16 is a nonvolatile memory semiconductor device according to a third embodiment of the present invention. A left figure of FIG. 16 is a cross-sectional view showing a memory cell along a word line and a right figure of FIG. 16 is a cross-sectional view showing the periphery circuit along the word line. FIG. 17 is a cross-sectional view showing a main portion of the fabricating processes of the nonvolatile memory semiconductor device in order according to the third embodiment of the present invention.

It is to be noted that the same or similar reference numerals are applied to the same or similar parts and elements throughout the drawings, and the description of the same or similar parts and elements will be omitted or simplified.

The third embodiment is different from the first embodiment at a point, for example, that an insulator is formed on a side-wall of the upper portion of the first conductive layer and a side-wall of the second concave portion.

As shown in FIG. 16, a non-volatile semiconductor memory device 60 in the embodiment includes an insulator 61 formed on a side-wall of the upper portion of the first conductive layer 51 and a side-wall of the second concave portion 51a in the periphery circuit region 11b.

As the upper portion of the second concave portion 51a and the first conductive layer 51 becomes thicker in a horizontal direction by the insulator 61, strength of the upper portion of the first conductive layer 51 is increased so that the upper portion of the first conductive layer 51 having the second concave portion 51a can be prevented from damages in processing steps.

Accordingly, the structure has capability to prevent that the damaged upper portion of the first conductive layer 51 generates dusts which contaminate on the semiconductor substrate 11 to short cut between adjoining gate electrodes so that of the non-volatile semiconductor memory device can be prevented from reliability deterioration.

Next, it is explained on a fabrication method of the non-volatile semiconductor memory device 60. First, according to the processing steps as shown in FIG. 13B, the poly-silicon film 37 is formed to be embedded into the first concave portion 15a for protecting the ONO film 16.

Figure 17:
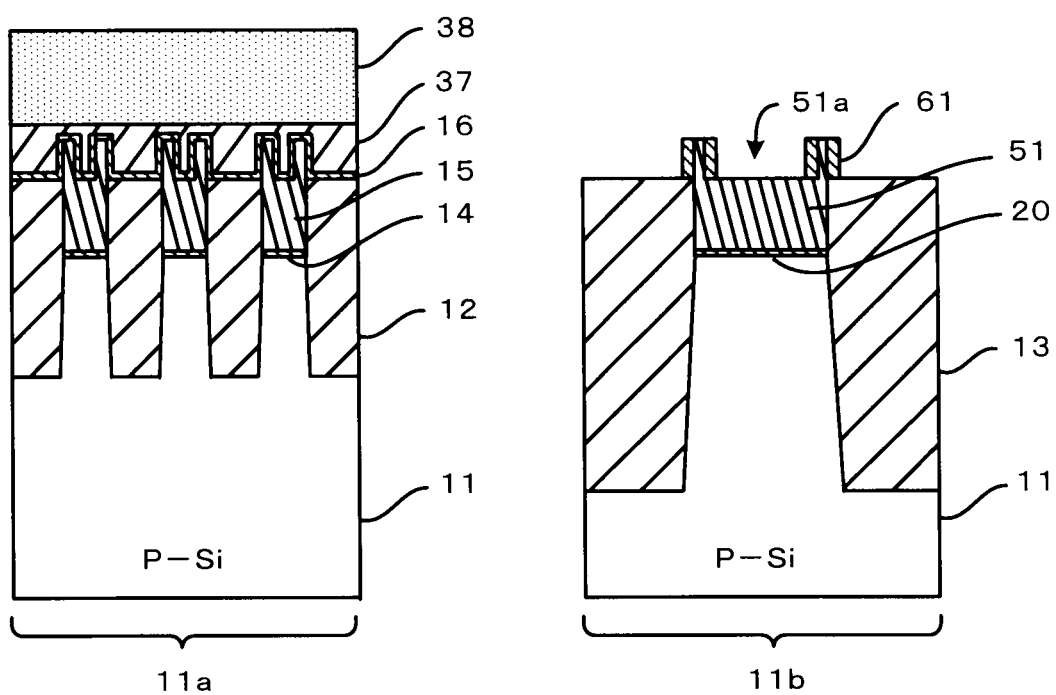
FIG. 17 is a cross-sectional view showing a main portion of the fabricating processes of the nonvolatile memory semiconductor device in order according to the third embodiment of the present invention.

As shown in FIG. 17, the memory cell region 11a is protected by a resist film 38, subsequently the poly-silicon film 37 in the periphery circuit region 11b is etched using the ONO film 16 as a stopper by RIE.

The ONO film 16 is etched by anisotropic etching to remove the upper surface of the first conductive layer 51, the bottom surface of the second concave portion 51a and the ONO film 16 of the second insulation isolation layer 13. On the contrary, the side-wall of the upper portion of the first conductive layer 51 and the ONO film 16 of the side-wall of the second concave portion 51a is leaved. The ONO film 16 is the insulator 61.

As similar to FIG. 14B, after removing the resist film 38, the poly-silicon film 39 is formed on the poly-silicon film 37 in the memory cell region 11a by CVD. Simultaneously, the poly-silicon film 39 is formed on the periphery circuit region 11b to be embedded into the second concave portion 51a.

As mentioned above, in this embodiment, the insulator 61 is formed on the side-wall of the upper portion of the first conductive layer 51 and the side-wall of the second concave portion 51a.

In this processes, strength of the upper portion of the first conductive layer 51 formed on the second concave portion 51a is improved to prevent damages in the processing steps.

Accordingly, the structure has capability to prevent that the damaged upper portion of the first conductive layer 51, so that dusts do not generate. Then contaminate on the semiconductor substrate 11 to short cut between adjoining gate electrodes dose not happen. The non-volatile semiconductor memory device can be prevented from reliability deterioration.

The processing steps have an advantage of performing the process without being increased with processing steps, such as etching process of ONO film 16 in the periphery circuit region 11b by only changing from isotropic etching to anisotropic etching.

Fourth Embodiment

Figure 19:
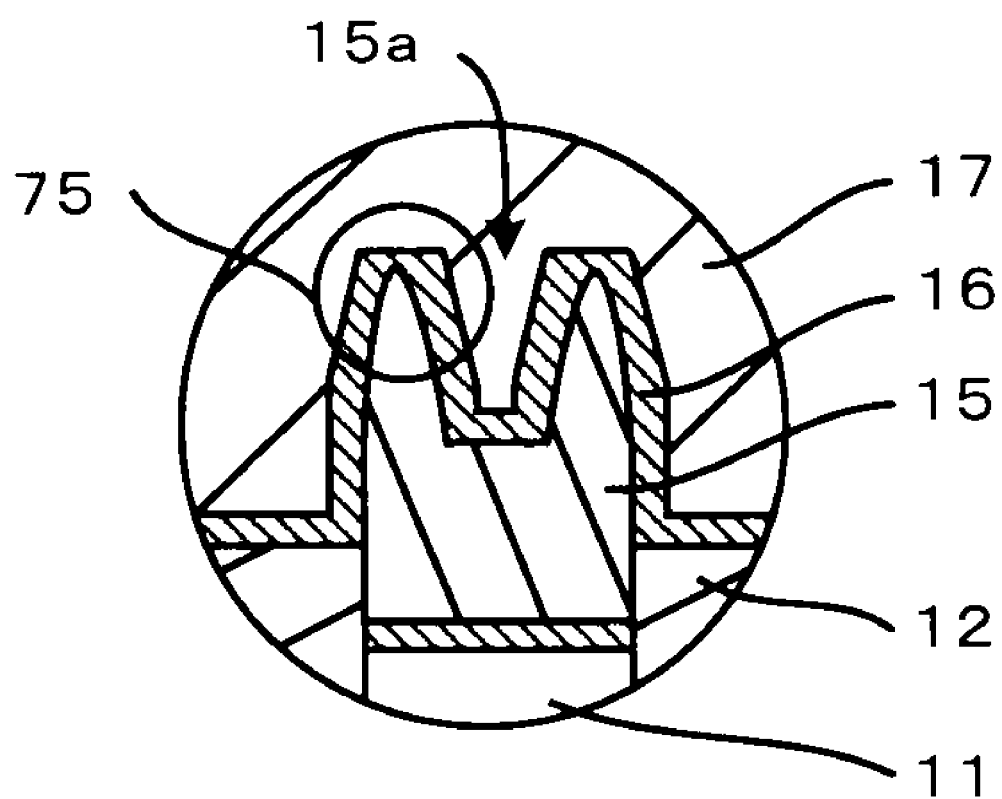
FIG. 19 is a cross-sectional view showing a main portion of the nonvolatile memory semiconductor device according to the fourth embodiment of the present invention.
Figure 20:
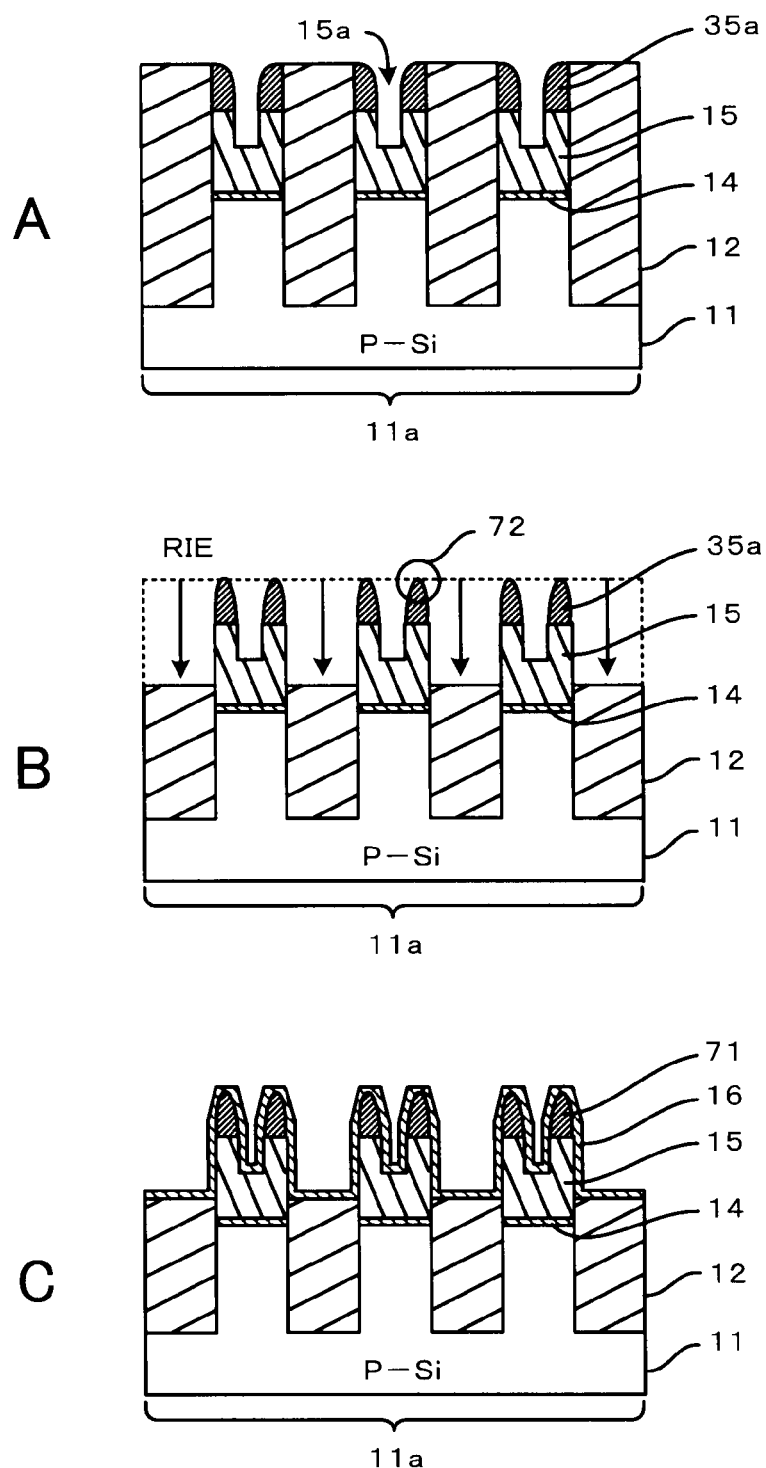
FIG. 20 is a cross-sectional view showing a main portion of the fabricating processes of the nonvolatile memory semiconductor device in order according to the fourth embodiment of the present invention.

Next, according to a fourth embodiment of the present invention, a nonvolatile memory semiconductor device and fabricating processes of the nonvolatile memory semiconductor device are explained with reference to FIGS. 18-20.

Figure 18:
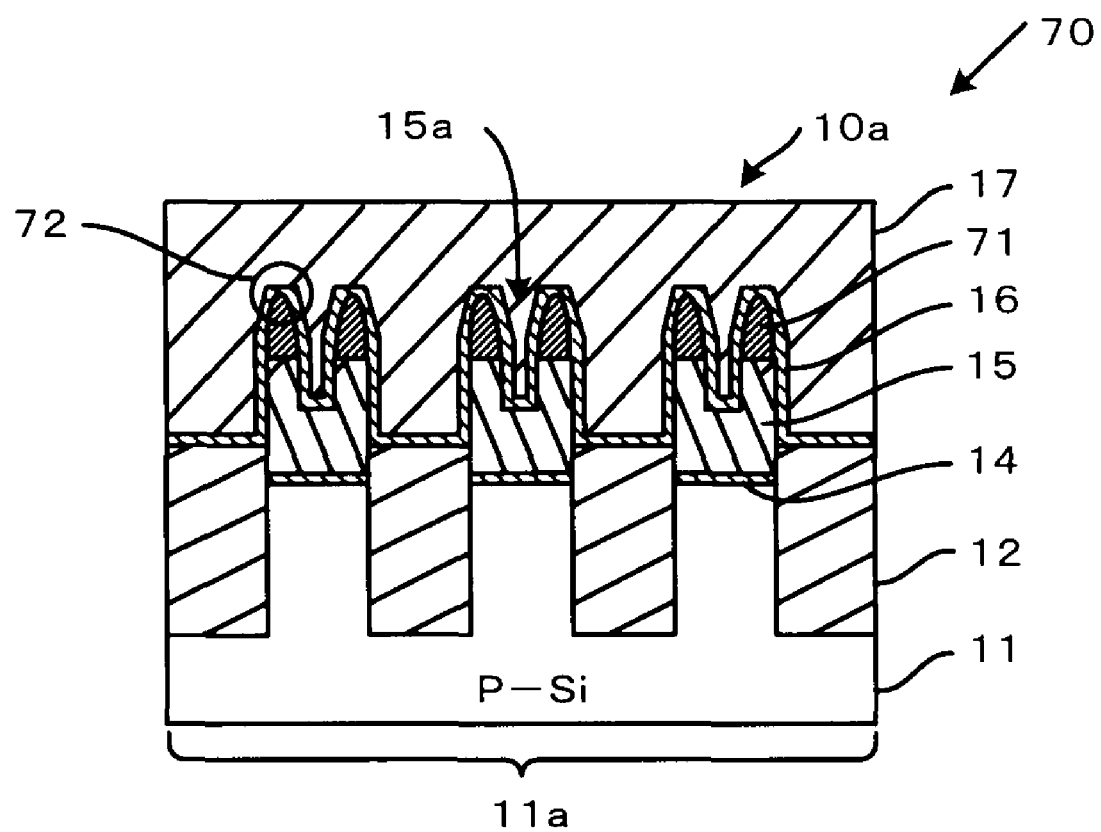
FIG. 18 is a cross-sectional view showing a memory cell along a word line according to the fourth embodiment of the present invention.

FIG. 18 is a cross-sectional view showing a memory cell along a word line. FIG. 19 is a cross-sectional view showing a main portion of the nonvolatile memory semiconductor device. FIG. 20 is a cross-sectional view showing a main portion of the fabricating processes of the nonvolatile memory semiconductor device in order.

It is to be noted that the same or similar reference numerals are applied to the same or similar parts and elements throughout the drawings, and the description of the same or similar parts and elements will be omitted or simplified.

The fourth embodiment is different from the first embodiment at a point, for example, that the third insulator is formed between an upper surface of the floating gate electrode and the ONO film.

As shown in FIG. 18, a non-volatile semiconductor memory device 70 includes a third insulator 71 having a steeple portion 72 with rounding at upper part therein in this embodiment. The third insulator 71 is formed between an upper surface of the floating gate electrode 15 and the ONO film 16 conformally covering the upper surface of the floating gate electrode 15.

An explanation mentioned below is omitted in the first embodiment. As shown in FIG. 19, the upper portion of the floating gate electrode 15 is etched to the second depth L2 to form the first concave portion 15a on the upper portion of the floating gate electrode 15 using the first side-wall film 35a as a mask in the non-volatile semiconductor memory device 10. In this processes, a steeple portion 75 may be formed on the upper portion of the floating gate electrode 15 when the side-wall film 35a and the first insulation isolation layer 12 are etched to a depth at the bottom surface of the first concave portion 15a.

The phenomena are generated in a state which a selective ratio between the floating gate electrode 15 and the first side-wall film 35a is large when the upper portion of the floating gate electrode 15 is etched to the second depth L2. As another case, the phenomena are generated in a state which a selective ratio between the floating gate electrode 15 and the first side-wall film 35a, and the first insulation isolation layer 12 is large when the floating gate electrode 15 and the first insulation isolation layer 12 are etched to the depth at the bottom in the first concave portion 15a.

When the steeple portion 75 is generated at the upper portion of the floating gate electrode 15, electric field is concentrated at the steeple portion 75. The ONO film 16 receives damage by the concentration to result in variation of leakage tolerance, coupling ratio or the like, so that characteristics and reliability of the non-volatile semiconductor memory device 10 are obstacle.

As the reason mentioned above, the steeple portion 72 is formed on the upper portion of the third insulator 71 formed between the upper surface of phenomenon floating gate electrode 15 and the ONO film 16 in the non-volatile semiconductor memory device 70. However, as the third insulator 71 is an insulator while the floating gate electrode 15 is a conductor, electric field added to the ONO film 16 is small even when electric field is concentrated into the steeple portion 72. As a result, electric damages on the ONO film 16 can be prevented.

Furthermore, the floating gate electrode 15 has some amount of the steeple portion and electric field is concentrated to the steeple portion, however, the third insulator 71 is formed between the upper surface of the floating gate electrode 15 and the ONO film 16 so that concentration of electric field to the ONO film 16 is decreased.

Accordingly, characteristics and reliability of the non-volatile semiconductor memory device can be prevented.

Next, a method for fabricating the non-volatile semiconductor memory device 70 is explained. FIG. 20 is a cross-sectional view showing a main portion of processing steps in the method for fabricating the non-volatile semiconductor memory device 70. As shown in FIG. 20A, the first concave portion 15a is formed on the floating gate electrode 15 as similar to FIGS. 4A-7A.

As shown in FIG. 20B, the first insulation isolation layer 12 is selectively removed to the depth at the bottom surface of the first concave portion 15a to leave the first side-wall film 35a on the floating gate electrode 15 and to expose a side-wall of the upper portion of the floating gate electrode 15. The first insulation isolation layer 12 is selectively removed utilizing a selective ratio between the first insulation isolation layer 12 and the first side-wall film 35a due to difference of film property or material property by wet etching or RIE, only first insulation isolation layer 12 is back etched.

For example, in a case of the first insulation isolation layer 12 being a silicon oxide film formed by HDP (High Density Plasma) CVD and the first side-wall film 35a being a silicon oxide film formed by CVD, the first side-wall film 35a has a higher density than the first insulation isolation layer 12 to obtain necessary selective-ratio. Further, the first insulation isolation layer 12 is a silicon oxide film and the first side-wall film 35a being a silicon nitride film may be adoptable. In this case, the selective ratio of the first side-wall film 35a to the first insulation isolation layer 12 is not sufficient, therefore, the first side-wall film 35a is also etched some amount to form the steeple portion 72 on the upper portion.

As shown in FIG. 20C, the ONO film 16 is comformally formed on the upper surface and the side-wall first side-wall film 35a, and the side-wall of the upper portion of the floating gate electrode 15 and the first insulation isolation layer 12 as similar to FIG. 8A. The first side-wall film 35a leaved between the upper surface of the floating gate electrode 15 and the upper portion of the ONO FILM 16 comformally covering the floating gate electrode 15 is called the third insulator 71.

As similar to FIG. 8B-FIG. 9B, the poly-silicon film 37 and the poly-silicon film 39 are formed on the ONO film 16 to be embedded into the first concave portion 15a. The poly-silicon films 37 and the poly-silicon film 39 collectively constitute the control gate electrode 17.

In this way, the non-volatile semiconductor memory device 70 including the third insulator 71 is obtained. The third insulator 71 is formed between the upper surface of the floating gate electrode 15 and the ONO film 16 conformally covering the upper portion of the floating gate electrode 15 as shown in FIG. 18.

As described above, the non-volatile semiconductor memory device 70 in this embodiment includes the third insulator 71 being formed between the upper surface of the floating gate electrode 15 and the ONO film 16 conformally covering the upper portion of the floating gate electrode 15.

Accordingly, an advantage of preventing from damages to ONO film 16 due to concentrated electric field to the floating gate electrode 15 can be obtained to stably sustain characteristics and reliability of the non-volatile semiconductor memory device 70.

The explanation mentioned above is omitted on the periphery circuit 10b in the first embodiment, however, the processing steps can be performed as similar to the first embodiment, the second embodiment and the third embodiment. The concave portion may not be formed on the first conductive layer 21 as shown in FIG. 1, the second concave portion 51a may not be formed on the first conductive layer 51 as shown in FIG. 11. The insulator 61 may not be formed on the side-wall of the upper portion first conductive layer 51 and the side-wall of the second concave portion 51a as shown in FIG. 16.

Fifth Embodiment

Figure 22:
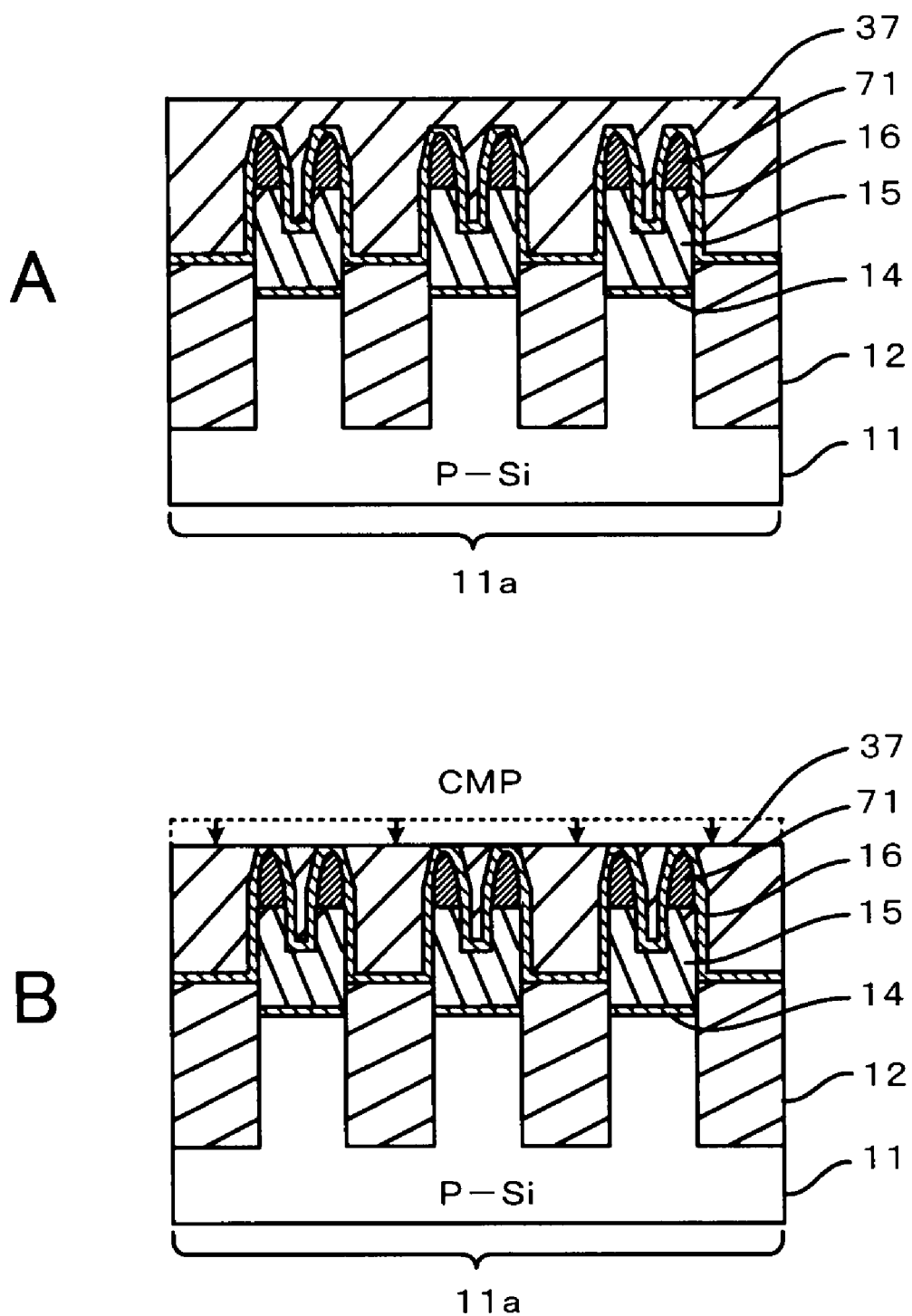
FIG. 22 is a cross-sectional view showing a main portion of the nonvolatile memory semiconductor device according to the fifth embodiment of the present invention.
Figure 23:
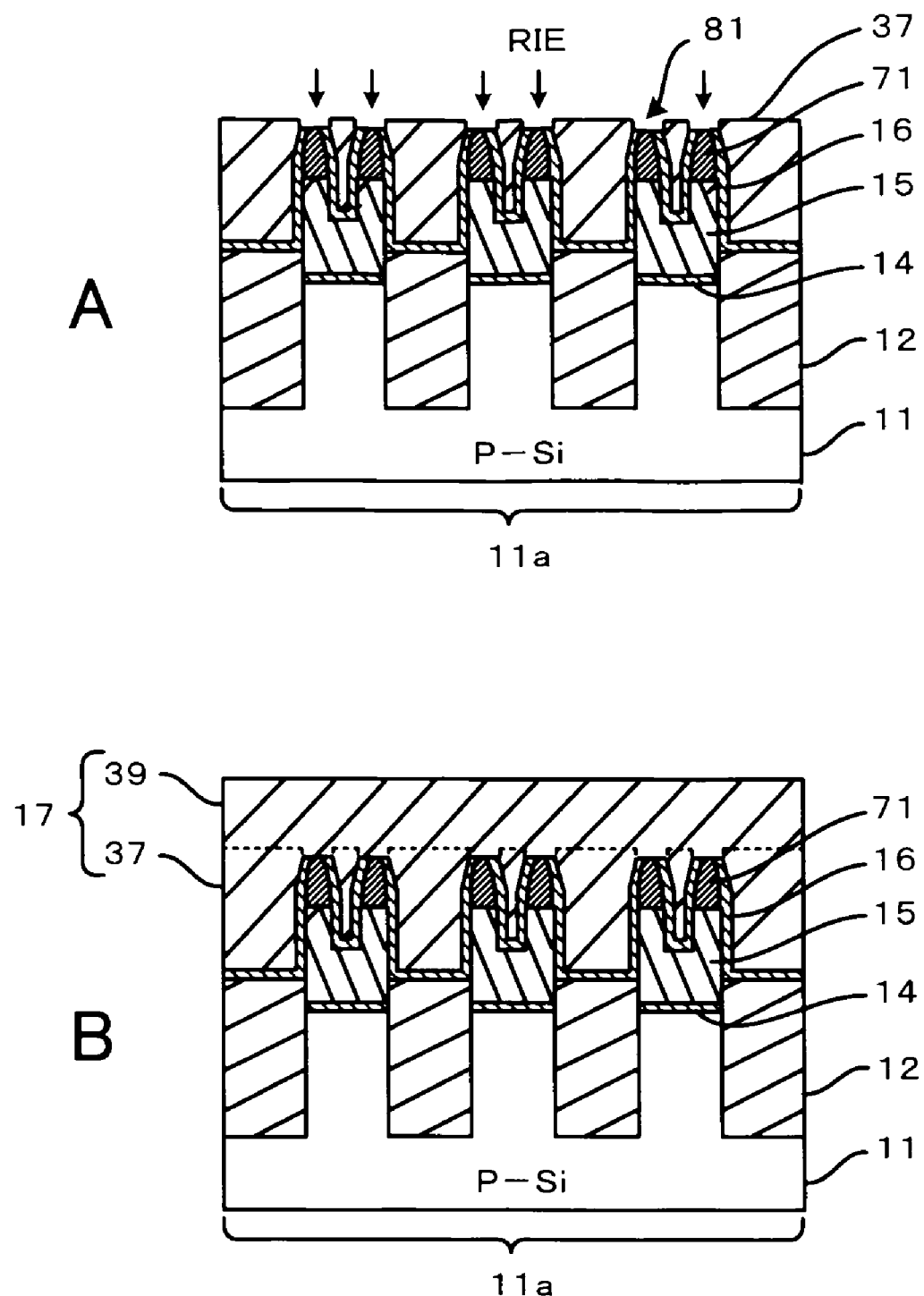
FIG. 23 is a cross-sectional view showing a main portion of the fabricating processes of the nonvolatile memory semiconductor device in order according to the fifth embodiment of the present invention.

Next, according to a fifth embodiment of the present invention, a nonvolatile memory semiconductor device and fabricating processes of the nonvolatile memory semiconductor device are explained with reference to FIGS. 21-23.

Figure 21:
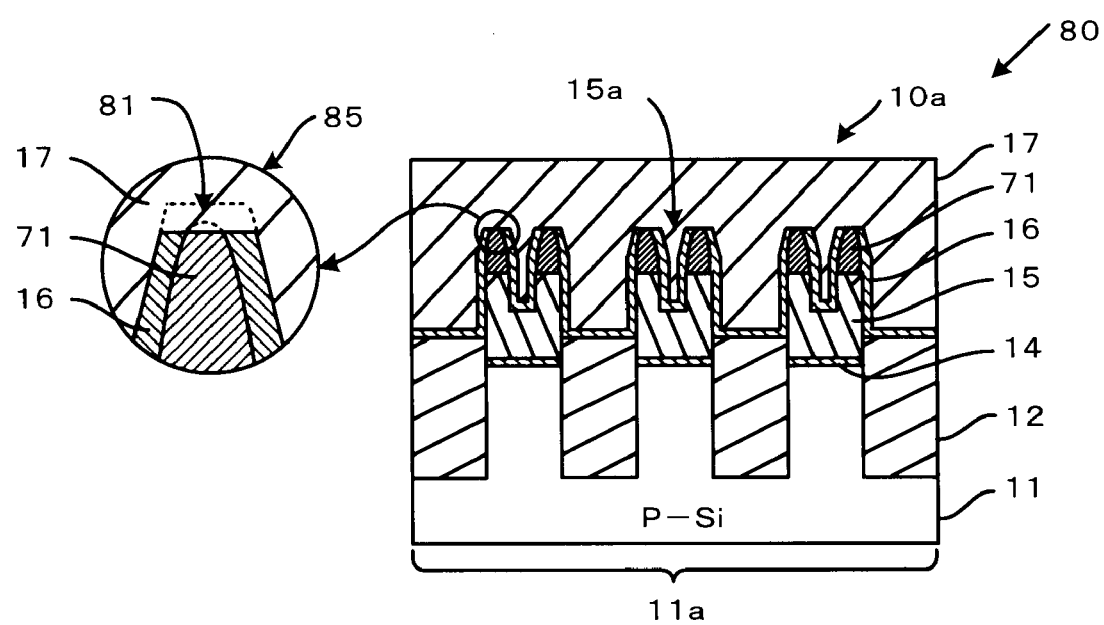
FIG. 21 is a cross-sectional view showing a memory cell along a word line according to the fifth embodiment of the present invention.

FIG. 21 is a cross-sectional view showing a memory cell along a word line. FIG. 22 is a cross-sectional view showing a main portion of the nonvolatile memory semiconductor device. FIG. 23 is a cross-sectional view showing a main portion of the fabricating processes of the nonvolatile memory semiconductor device.

It is to be noted that the same or similar reference numerals are applied to the same or similar parts and elements throughout the drawings, and the description of the same or similar parts and elements will be omitted or simplified.

The fifth embodiment is different from the forth embodiment at a point, for example, that an ONO film includes an opening which expose an upper surface of the third insulator.

As shown in FIG. 21, the non-volatile semiconductor memory device 80 in this embodiment includes an opening 81 which exposes an upper surface of the third insulator 71 in the ONO film 16. The upper surface of the third insulator 71 contacts with the control gate electrode 17. The opening 81 with a stripe shape is formed for orthogonal direction to the word line direction (bit line direction perpendicular to the drawing paper). The ONO film 16 is not present on the upper surface of the third insulator 71.

It is well known electric charges are transported at an interface between laminated layers of the ONO film 16 which is stacked with a silicon oxide film, a silicon nitride film and a silicon oxide film in order. The transportation of electric charges accumulated in the floating gate electrode 15 at the interface between the laminated layer cause to be decreased the electric charges accumulated in the floating gate electrode 15. Accordingly, data retention characteristic of the memory cell 10a and/or interference between the cells are caused. The interference is due to accumulation of the electric charges being transported between adjoining floating gate electrodes 15 sandwiching the first insulation isolation layer 12. As a result, characteristics and reliability of the non-volatile semiconductor memory device may be decrease.

However, the ONO film 16 is not present on the upper surface of the third insulator 71 in the non-volatile semiconductor memory device 80 in this embodiment, therefore it is suppressed the electric charges accumulated in the floating gate electrode 15 transport at the interface in the ONO film 16. Accordingly, characteristic and reliability of the non-volatile semiconductor memory device can be prevented.

next, a method for fabricating the non-volatile semiconductor memory device 80 is explained below. FIGS. 22 and 23 are cross-sectional views showing a main portion in processing steps of the non-volatile semiconductor memory device 80. First, the ONO film 16 is conformally formed on the upper surface and the side-wall of the first side-wall film 35a, the side-wall of the upper portion of the floating gate electrode 15 and the upper surface of the first insulation isolation layer 12, similarly as the processing steps as shown in FIG. 20C.

As shown in FIG. 22A, the poly-silicon film 37 is formed on the ONO film 16 to be embedded as the floating gate electrode 15, similarly as the processing steps as shown in FIG. 8B. As shown in FIG. 22B, the poly-silicon film 37 is removed, for example, using the ONO film 16 as a stopper by CMP to expose the upper surface of the ONO film 16.

As shown in FIG. 23A, the ONO film 16 selectively removed, for example, by RIE using a florine-based gas to expose the upper surface of the third insulator 71. In this way, the opening 81 is formed to expose the upper surface of the third insulator 71 in the ONO film 16. As shown in FIG. 23B, the poly-silicon film 39 is formed on the poly-silicon film 37 to cover the upper surface of the third insulator 71, as similarly as FIG. 9B. The poly-silicon film 39 is increasingly formed on the poly-silicon film 37 to constitute the control gate electrode 17, so that the upper surface of the third insulator 71 contacts with the control gate electrode 17.

In this way, the ONO film 16 as shown in FIG. 21 has the opening 81 to expose the upper surface of the third insulator 71, so that the non-volatile semiconductor memory device 80 having the upper surface of the third insulator 71 contacting with control gate electrode 17 is obtained.

As described above, the non-volatile semiconductor memory device 80 in this embodiment has the opening 81 to expose the ONO film 16 in the upper surface of the third insulator 71. The upper surface of the third insulator 71 contacts the control gate electrode 17.

As a result, the electric charges accumulated in the floating gate electrode 15 are eliminated by transporting at the interface in the ONO film 16 formed by the laminated layers. The characteristics and reliability of the non-volatile semiconductor memory device 80 is improved.

This embodiment explains the poly-silicon film 37 is removed using the ONO film 16 as the stopper by CMP and the ONO film 16 is selectively removed to expose in the upper surface of the third insulator 71 by RIE. The upper surface of the ONO film 16 can be removed using the third insulator 71 as a stopper by CMP to expose the upper surface of the third insulator 71.

Furthermore, instead of CMP, the poly-silicon film 37 may be removed by RIE using a chlorine-based and florine-based gas. The technique is adoptable in a case which a height of a transistor is difference between the memory cell region 11*a* and the periphery circuit region 11*b*.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

What is claimed is:

1. A nonvolatile semiconductor memory device comprising:
   a memory cell including a cell transistor and a first insulation isolation layer in a first region of a semiconductor substrate,
   the cell transistor including a first gate insulator, a first gate electrode formed on the first gate insulator, an upper portion of the first gate electrode having a first concave portion, a second gate insulator covering the upper portion of the first gate electrode, a second gate electrode being embedded into the first concave portion and being formed on the second gate insulator, and
   the first insulation isolation layer being extended to a side-wall of the first gate electrode from the semiconductor substrate to be embedded in the semiconductor substrate to electrically separate the cell transistor; and
   a periphery circuit including a transistor and a second insulation isolation layer in a second region of the semiconductor substrate,
   the transistor including a third gate insulator being the same material as the first gate insulator, a gate electrode having a first conductive layer and a second conductive layer, the first conductive layer being formed on the third gate insulator, the second conductive layer having the same material as the first gate electrode and being formed to contact with the upper surface of the first conductive layer, and
   the second insulation isolation layer being extended to a side-wall of the second gate electrode from the semiconductor substrate to be embedded in the semiconductor substrate to electrically separate the transistor,
   wherein a third insulator is formed only between the second gate insulator and top portions of the first gate electrode on opposite sides of the first concave portion, and the second gate insulator is conformally formed covering the upper portion of the third insulator.

2. The nonvolatile semiconductor memory device according to claim 1, wherein
   a steeple portion is formed on an upper portion of the third insulator.

3. The nonvolatile semiconductor memory device according to claim 1, wherein
   the second gate insulator has an opening which exposes the upper surface of the third insulator and the upper surface of the third insulator contacting with the second gate electrode.

* * * * *